(12) United States Patent
Katkar et al.

(10) Patent No.: US 9,355,997 B2
(45) Date of Patent: May 31, 2016

(54) INTEGRATED CIRCUIT ASSEMBLIES WITH REINFORCEMENT FRAMES, AND METHODS OF MANUFACTURE

(71) Applicant: Invensas Corporation, San Jose, CA (US)

(72) Inventors: Rajesh Katkar, San Jose, CA (US); Laura Wills Mirkarimi, Sunol, CA (US); Arkalgud Sitaram, Cupertino, CA (US); Charles G. Woychik, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/288,064

(22) Filed: May 27, 2014

(65) Prior Publication Data

US 2015/0262972 A1     Sep. 17, 2015

Related U.S. Application Data

(63) Continuation-in-part of application No. 14/214,365, filed on Mar. 14, 2014.

(60) Provisional application No. 61/952,066, filed on Mar. 12, 2014.

(51) Int. Cl.
    *H01L 25/065*     (2006.01)
    *H01L 23/367*     (2006.01)
    (Continued)

(52) U.S. Cl.
CPC .......... *H01L 25/0655* (2013.01); *H01L 21/561* (2013.01); *H01L 21/78* (2013.01); *H01L 22/32* (2013.01); *H01L 23/10* (2013.01); *H01L 23/147* (2013.01); *H01L 23/3121* (2013.01); *H01L 23/3135* (2013.01); *H01L 23/367* (2013.01); *H01L 23/3675* (2013.01); *H01L 23/49827* (2013.01); *H01L 24/94* (2013.01);
(Continued)

(58) Field of Classification Search
CPC ...... H01L 29/84; H01L 23/538; H01L 131/12
See application file for complete search history.

(56) References Cited

U.S. PATENT DOCUMENTS

| | | | |
|---|---|---|---|
| 5,532,519 | A | 7/1996 | Bertin et al. |
| 5,701,233 | A | 12/1997 | Carson et al. |

(Continued)

FOREIGN PATENT DOCUMENTS

| | | |
|---|---|---|
| EP | 1688994 B1 | 8/2008 |
| EP | 2546876 A1 | 1/2013 |

(Continued)

OTHER PUBLICATIONS

U.S. Appl. No. 14/328,380 titled, "Microelectronic Assemblies With Integrated Circuits and Interposers With Cavities, and Methods of Manufacture," filed Jul. 10, 2014.

(Continued)

*Primary Examiner* — Matthew W Such
*Assistant Examiner* — Krista Soderholm
(74) *Attorney, Agent, or Firm* — Haynes and Boone, LLP

(57) ABSTRACT

An assembly with modules (110, 1310) containing integrated circuits and attached to a wiring substrate (120) is reinforced by one or more reinforcement frames (410) attached to the wiring substrate. The modules are located in openings (e.g. cavities and/or through-holes 414) in the reinforcement frame. Other features are also provided.

22 Claims, 33 Drawing Sheets

(51) Int. Cl.
*H01L 21/66* (2006.01)
*H01L 21/78* (2006.01)
*H01L 23/10* (2006.01)
*H01L 23/14* (2006.01)
*H01L 23/498* (2006.01)
*H01L 25/00* (2006.01)
*H01L 21/56* (2006.01)
*H01L 23/31* (2006.01)
*H01L 23/00* (2006.01)
*H01L 23/04* (2006.01)
*H01L 21/784* (2006.01)
*H01L 25/18* (2006.01)

(52) U.S. Cl.
CPC .......... *H01L 24/97* (2013.01); *H01L 25/0652* (2013.01); *H01L 25/50* (2013.01); *H01L 21/784* (2013.01); *H01L 23/04* (2013.01); *H01L 23/49838* (2013.01); *H01L 24/05* (2013.01); *H01L 24/06* (2013.01); *H01L 24/13* (2013.01); *H01L 24/14* (2013.01); *H01L 24/16* (2013.01); *H01L 24/17* (2013.01); *H01L 24/32* (2013.01); *H01L 24/73* (2013.01); *H01L 24/83* (2013.01); *H01L 24/92* (2013.01); *H01L 25/18* (2013.01); *H01L 2224/0401* (2013.01); *H01L 2224/05568* (2013.01); *H01L 2224/05569* (2013.01); *H01L 2224/0603* (2013.01); *H01L 2224/06181* (2013.01); *H01L 2224/131* (2013.01); *H01L 2224/1403* (2013.01); *H01L 2224/14181* (2013.01); *H01L 2224/16145* (2013.01); *H01L 2224/16225* (2013.01); *H01L 2224/17181* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/83192* (2013.01); *H01L 2224/92125* (2013.01); *H01L 2224/92225* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06589* (2013.01); *H01L 2225/06596* (2013.01); *H01L 2924/12042* (2013.01); *H01L 2924/15192* (2013.01); *H01L 2924/15311* (2013.01); *H01L 2924/164* (2013.01); *H01L 2924/167* (2013.01); *H01L 2924/1615* (2013.01); *H01L 2924/1632* (2013.01); *H01L 2924/1679* (2013.01); *H01L 2924/16152* (2013.01); *H01L 2924/16153* (2013.01); *H01L 2924/16176* (2013.01); *H01L 2924/16235* (2013.01); *H01L 2924/16251* (2013.01); *H01L 2924/16788* (2013.01); *H01L 2924/351* (2013.01); *H01L 2924/3511* (2013.01)

(56) References Cited

U.S. PATENT DOCUMENTS

| | | | |
|---|---|---|---|
| 6,157,076 A | 12/2000 | Azotea et al. | |
| 6,222,722 B1 | 4/2001 | Fukuzumi et al. | |
| 6,251,796 B1 | 6/2001 | Abdul-Ridha et al. | |
| 6,322,903 B1 | 11/2001 | Siniaguine et al. | |
| 6,384,473 B1 | 5/2002 | Peterson et al. | |
| 6,403,444 B2 | 6/2002 | Fukuzumi et al. | |
| 6,451,650 B1 | 9/2002 | Lou | |
| 6,492,726 B1 | 12/2002 | Quek et al. | |
| 6,613,672 B1 | 9/2003 | Wang et al. | |
| 6,620,701 B2 | 9/2003 | Ning | |
| 6,624,505 B2 | 9/2003 | Badehi | |
| 6,717,254 B2 | 4/2004 | Siniaguine | |
| 6,746,876 B2 | 6/2004 | Itoh et al. | |
| 6,787,916 B2 | 9/2004 | Halahan | |
| 6,947,275 B1 | 9/2005 | Anderson et al. | |
| 6,958,285 B2 | 10/2005 | Siniaguine | |
| 7,011,988 B2 | 3/2006 | Forcier | |
| 7,049,170 B2 | 5/2006 | Savastiouk et al. | |
| 7,061,102 B2 | 6/2006 | Eghan et al. | |
| 7,115,988 B1 | 10/2006 | Hool | |
| 7,144,745 B2 | 12/2006 | Badehi | |
| 7,183,643 B2 | 2/2007 | Gibson et al. | |
| 7,400,036 B2 | 7/2008 | Tan | |
| 7,670,921 B2 | 3/2010 | Chinthakindi et al. | |
| 7,863,096 B2 * | 1/2011 | England | 438/108 |
| 7,906,803 B2 | 3/2011 | Shioya et al. | |
| 7,928,548 B2 | 4/2011 | Bernstein et al. | |
| 7,977,579 B2 | 7/2011 | Bathan et al. | |
| 7,989,270 B2 | 8/2011 | Huang et al. | |
| 8,018,068 B1 | 9/2011 | Scanlan | |
| 8,071,470 B2 | 12/2011 | Khor et al. | |
| 8,072,082 B2 | 12/2011 | Yean et al. | |
| 8,076,788 B2 | 12/2011 | Haba et al. | |
| 8,102,039 B2 | 1/2012 | Noma et al. | |
| 8,110,862 B2 | 2/2012 | Cheng et al. | |
| 8,183,696 B2 | 5/2012 | Meyer | |
| 8,257,985 B2 * | 9/2012 | Stevenson et al. | 438/14 |
| 8,377,829 B2 | 2/2013 | Yeh et al. | |
| 8,378,480 B2 | 2/2013 | Chen et al. | |
| 8,397,013 B1 | 3/2013 | Rosenband et al. | |
| 8,426,961 B2 | 4/2013 | Shih et al. | |
| 8,470,668 B2 | 6/2013 | Cho et al. | |
| 8,518,753 B2 | 8/2013 | Wu et al. | |
| 8,519,537 B2 | 8/2013 | Jeng et al. | |
| 8,525,318 B1 | 9/2013 | Kim | |
| 8,575,493 B1 | 11/2013 | Xu et al. | |
| 8,598,695 B2 | 12/2013 | Oganesian et al. | |
| 8,629,546 B1 | 1/2014 | Scanlan | |
| 8,674,423 B2 | 3/2014 | Collins et al. | |
| 9,165,793 B1 | 10/2015 | Wang | |
| 2004/0174682 A1 * | 9/2004 | Lin et al. | 361/705 |
| 2004/0178495 A1 | 9/2004 | Yean | |
| 2004/0183187 A1 | 9/2004 | Yamasaki et al. | |
| 2004/0201111 A1 | 10/2004 | Thurgood | |
| 2004/0238934 A1 | 12/2004 | Warner et al. | |
| 2005/0046002 A1 | 3/2005 | Lee | |
| 2005/0047094 A1 | 3/2005 | Hsu et al. | |
| 2005/0068739 A1 | 3/2005 | Arvelo et al. | |
| 2005/0196095 A1 | 9/2005 | Karashima et al. | |
| 2005/0263869 A1 | 12/2005 | Tanaka et al. | |
| 2005/0266701 A1 | 12/2005 | Aoyagi | |
| 2007/0029654 A1 | 2/2007 | Sunohara et al. | |
| 2007/0045798 A1 | 3/2007 | Horie et al. | |
| 2007/0221399 A1 | 9/2007 | Nishizawa et al. | |
| 2007/0235850 A1 | 10/2007 | Gerber et al. | |
| 2008/0128897 A1 | 6/2008 | Chao | |
| 2008/0244902 A1 | 10/2008 | Blackwell et al. | |
| 2008/0280394 A1 | 11/2008 | Murtuza | |
| 2009/0008762 A1 | 1/2009 | Jung | |
| 2009/0115047 A1 | 5/2009 | Haba et al. | |
| 2009/0267238 A1 | 10/2009 | Joseph et al. | |
| 2010/0025081 A1 | 2/2010 | Arai et al. | |
| 2010/0084761 A1 | 4/2010 | Shinagawa | |
| 2010/0134991 A1 | 6/2010 | Kim | |
| 2010/0144101 A1 | 6/2010 | Chow | |
| 2010/0224980 A1 | 9/2010 | Chahal et al. | |
| 2010/0230797 A1 | 9/2010 | Honda | |
| 2010/0230806 A1 | 9/2010 | Huang et al. | |
| 2010/0276799 A1 | 11/2010 | Heng et al. | |
| 2011/0027967 A1 | 2/2011 | Beyne et al. | |
| 2011/0068468 A1 | 3/2011 | Lin | |
| 2011/0080713 A1 | 4/2011 | Sunohara | |
| 2011/0101349 A1 * | 5/2011 | Oda | 257/48 |
| 2011/0221072 A1 | 9/2011 | Chin | |
| 2011/0287606 A1 | 11/2011 | Brun et al. | |
| 2011/0304036 A1 | 12/2011 | Son | |
| 2012/0061852 A1 | 3/2012 | Su et al. | |
| 2012/0086135 A1 | 4/2012 | Thompson et al. | |
| 2012/0091583 A1 | 4/2012 | Kawashita et al. | |
| 2012/0101540 A1 * | 4/2012 | O'Brien et al. | 607/9 |
| 2012/0106228 A1 | 5/2012 | Lee | |

(56) References Cited

U.S. PATENT DOCUMENTS

| | | |
|---|---|---|
| 2012/0228778 A1 | 9/2012 | Kosenko et al. |
| 2012/0276733 A1 | 11/2012 | Saeki et al. |
| 2012/0295415 A1 | 11/2012 | Ono |
| 2012/0319300 A1 | 12/2012 | Kim et al. |
| 2013/0010441 A1 | 1/2013 | Oganesian et al. |
| 2013/0014978 A1 | 1/2013 | Uzoh et al. |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0119527 A1 | 5/2013 | Luo et al. |
| 2013/0119528 A1 | 5/2013 | Groothuis et al. |
| 2013/0146991 A1 | 6/2013 | Otremba et al. |
| 2013/0181354 A1 | 7/2013 | Khan et al. |
| 2013/0228898 A1 | 9/2013 | Ide |
| 2013/0241026 A1 | 9/2013 | Or-Bach et al. |
| 2013/0267046 A1 | 10/2013 | Or-Bach et al. |
| 2013/0270660 A1 | 10/2013 | Bryzek et al. |
| 2013/0292840 A1 | 11/2013 | Shoemaker et al. |
| 2013/0313680 A1 | 11/2013 | Oganesian et al. |
| 2014/0036454 A1 | 2/2014 | Caskey et al. |
| 2014/0070380 A1 | 3/2014 | Chiu et al. |
| 2014/0134796 A1 | 5/2014 | Kelly et al. |
| 2014/0134803 A1 | 5/2014 | Kelly |
| 2015/0262902 A1 | 9/2015 | Shen |
| 2015/0262928 A1 | 9/2015 | Shen |

FOREIGN PATENT DOCUMENTS

| | | |
|---|---|---|
| WO | WO 2005/022630 A1 | 3/2005 |
| WO | WO 2006/124597 A2 | 11/2006 |
| WO | WO 2007/142721 A1 | 12/2007 |
| WO | WO 2009/070348 A1 | 6/2009 |
| WO | WO 2012/169162 A1 | 12/2012 |
| WO | WO 2013/062533 A1 | 5/2013 |

OTHER PUBLICATIONS

U.S. Appl. No. 14/268,899 titled, "Making Electrical Components in Handle Wafers of Integrated Circuit Packages," filed May 2, 2014.

K.T. Turner et al., "Mechanics of direct wafer bonding", Proc. R. Soc. A, 462, 171-188, Nov. 9, 2005.

Pre-Interview First Office Action dated Oct. 22, 2014 of U.S. Appl. No. 14/214,365.

A. Strandjord et al., "Bumping for WLCSP using Solder Ball Attach on electrolessss NiAu UBM", Pac Tech USA—Packaging Technologies, Inc., 29 pages, 2008.

M.A. Boyle et al., "Epoxy Resins", Composites, vol. 21, ASM Handbook, ASM International, p. 78-89, 2001.

U.S. Appl. No. 14/558,462 titled, "Interposers With Circuit Modules Encapsulated by Moldable Material in a Cavity, and Methods of Fabrication", filed Dec. 2, 2014.

Li Shang et al., "Thermal Crisis: Challenges and Potential Solutions," Potentials, vol. 25, Issue 5, Sep./Oct. 2006, pp. 31-35.

Dr. Paul A. Magill, "A New Thermal-Management Paradigm for Power Devices," Power Electronics Technology, Nov. 2008, pp. 26-30.

San Hwui Lee et al., "Wafer-to-Wafer Alignment for Three Dimensional Integration: A Review," Journal of Microelectromechanical Systems, vol. 20, Issue 4, Aug. 2011, pp. 885-898.

Herming Chiueh et al., "A Dynamic Thermal Management Circuit for System-On-Chip Designs," Analog Integrated Circuits and Signal Processing, 36, pp. 175-181, Jan. 25, 2003.

K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).

ChipScale Review, "The Impact of CSPs on Encapsulation Materials," ChipScale Review publication issue Mar. 1998, retrieved Feb. 21, 2014, 6 pages.

Hybrid Memory Cube Consortium, "Hybrid Memory Cube Specification 1.0," Last Revision Jan. 2013, 122 pages, Retrieved from: http://hybridmemorycube.org/specification-download/.

Lau et al., "Thin-Wafer Handling with a Heat-Spreader Wafer for 2.5D/3D IC Integration," 46th International Symposium on Microelectronics (IMAPS 2013) Sep. 30-Oct. 3, 2013, Orlando, FL USA, pp. 1-8 [389-396].

Nakamura et al., "Technology Trends and Future History of Semiconductor Packaging Substrate Material," Hitachi Chemical Review Technical Report No. 55, May 2013, pp. 24-29.

Pulliam, Wayne, "Designing with BGAs," AMD presentation, 2008, 62 pages.

U.S. Appl. No. 14/201,585, filed Mar. 7, 2014.

U.S. Appl. No. 14/214,365 titled, "Integrated Circuits Protected by Substrates with Cavities, and Methods of Manufacture," filed Mar. 14, 2014, 40 pages.

Dreiza; Moody et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16, Rimini, Italy, 8 pages.

Zwenger; Curtis et al., "Next Generation Package-on-Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.

Kim; Jinseong et al., "Application of Through Mold Via (TMV) as PoP base package," Amkor Technology, 2008 IEEE Reprinted from ECTC2008 Proceedings, 6 pages.

U.S. Appl. No. 14/250,317 titled "Die Stacks With One or More Bond Via Arrays," filed Apr. 10, 2014, 58 pages.

Das; Rabindra N. et al., "Package-Interpose-Package (PIP) Technology for High End Electronics," Endicott Interconnect Technologies, Inc., retrieved Jul. 31, 2014, 4 pages.

McCormick; Heather et al., "Assembly and Reliability Assessment of Fine Pitch TMV Package on Package (PoP) Components," Amkor Technology Inc., Originally published in the Proceedings of the SMTA International Conference, San Diego, CA, Oct. 4-8, 2009, 8 pages.

International Search Report and Written Opinion for PCT/US2015/019609 dated May 12, 2015, 11 pages.

Office Action dated Jul. 9, 2015 for U.S. Appl. No. 14/558,462, 11 pages.

Final Office Action dated Mar. 2, 2015 of U.S. Appl. No. 14/214,365.

Notice of Allowance dated Apr. 16, 2015 of U.S. Appl. No. 14/268,899.

International Search Report and Written Opinion, Aug. 6, 2015, 10 pages, PCT Patent Application No. PCT/US2015/028172.

International Search Report and Written Opinion for PCT/US2015/032572 dated Nov. 23, 2015.

* cited by examiner

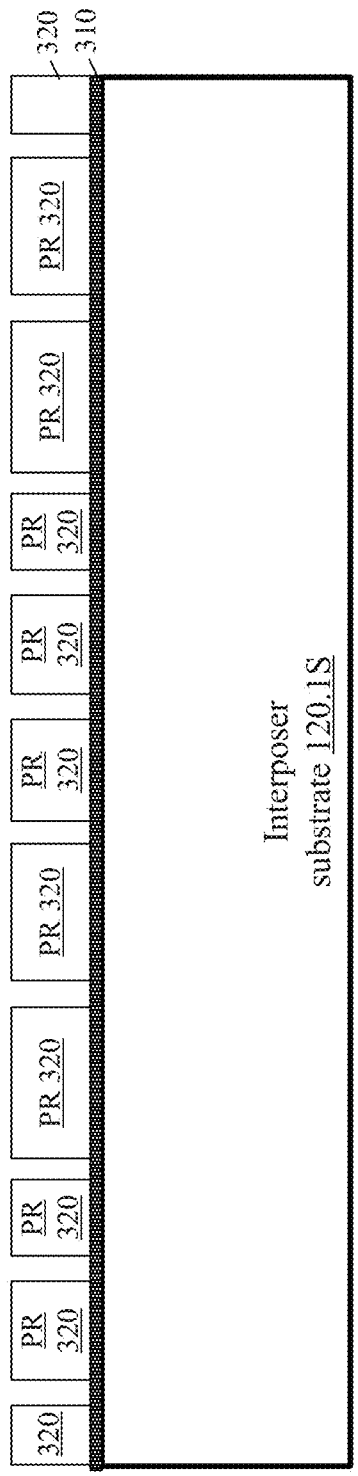
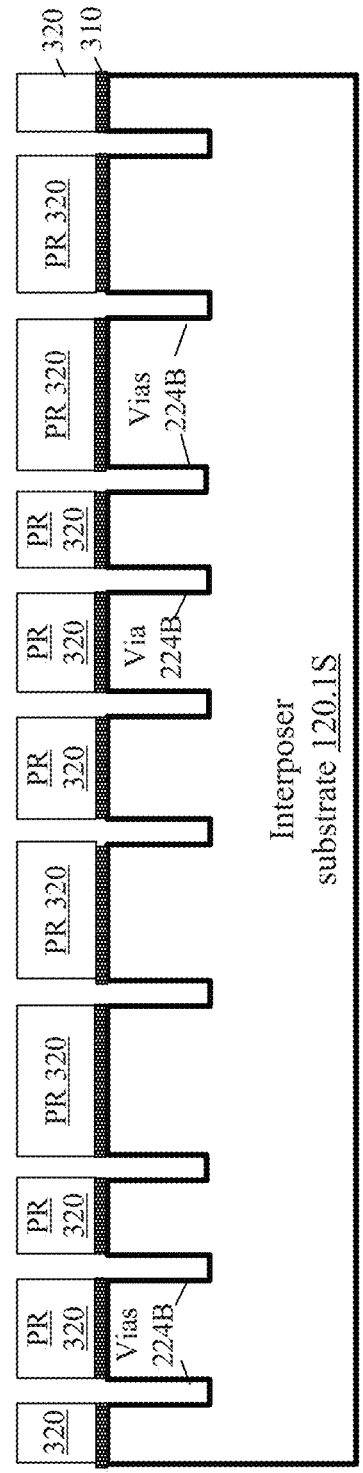

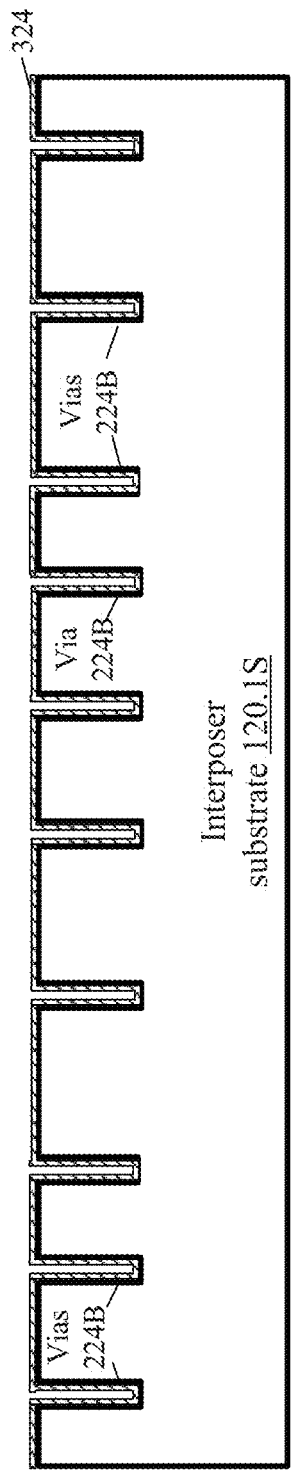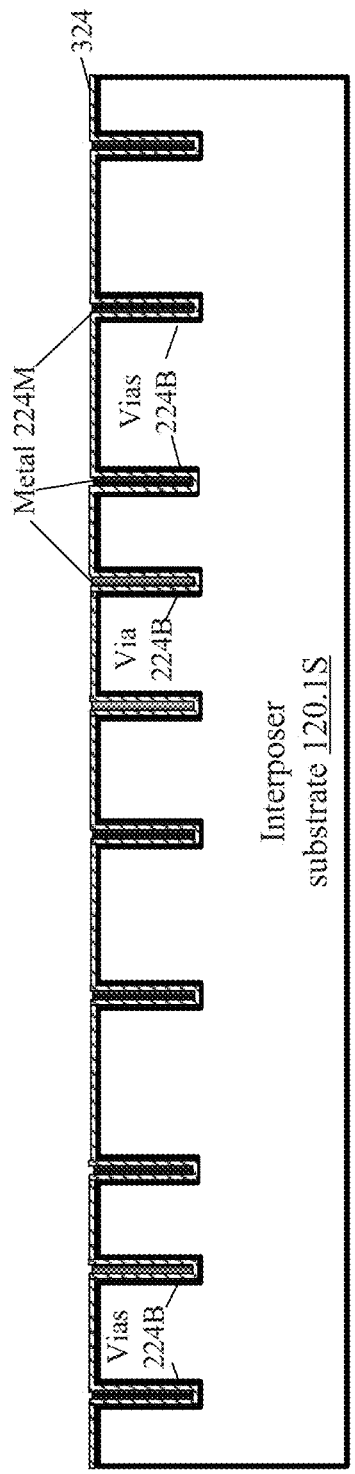

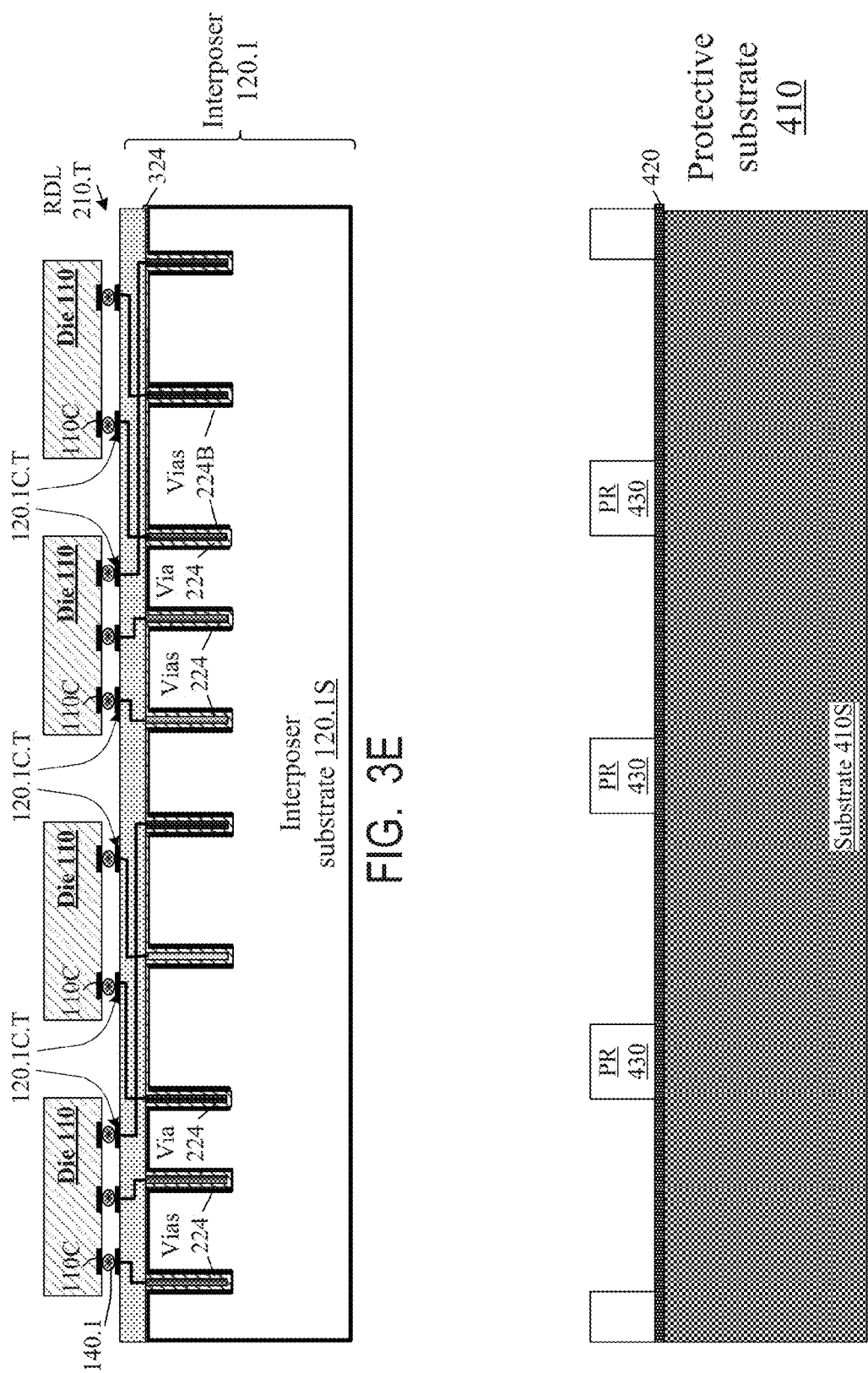

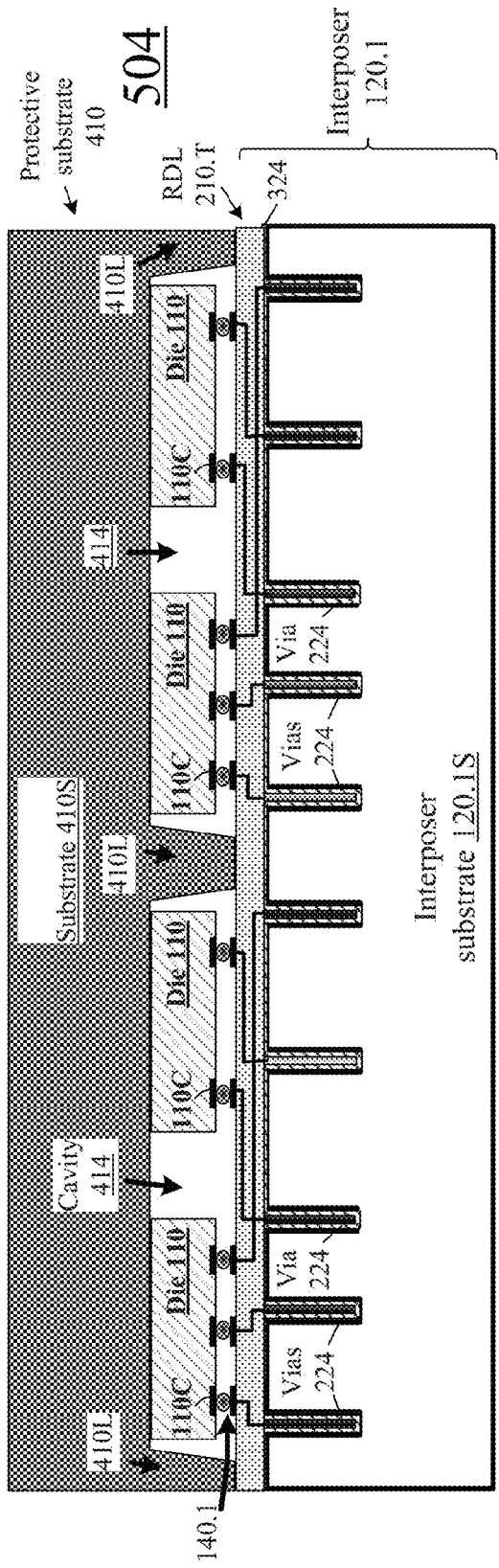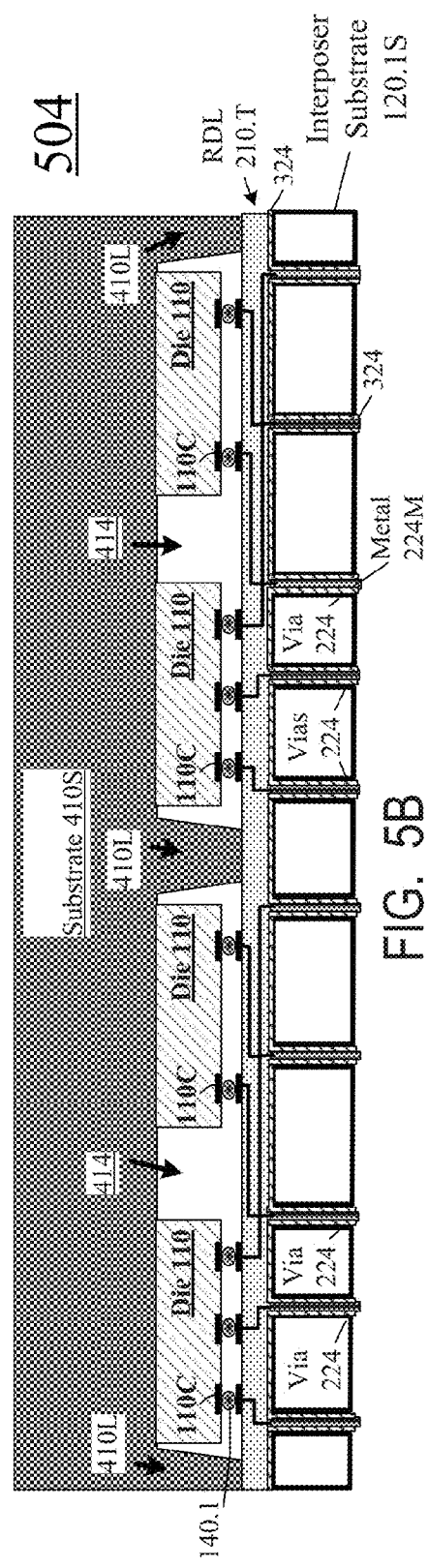
FIG. 5A
FIG. 5B

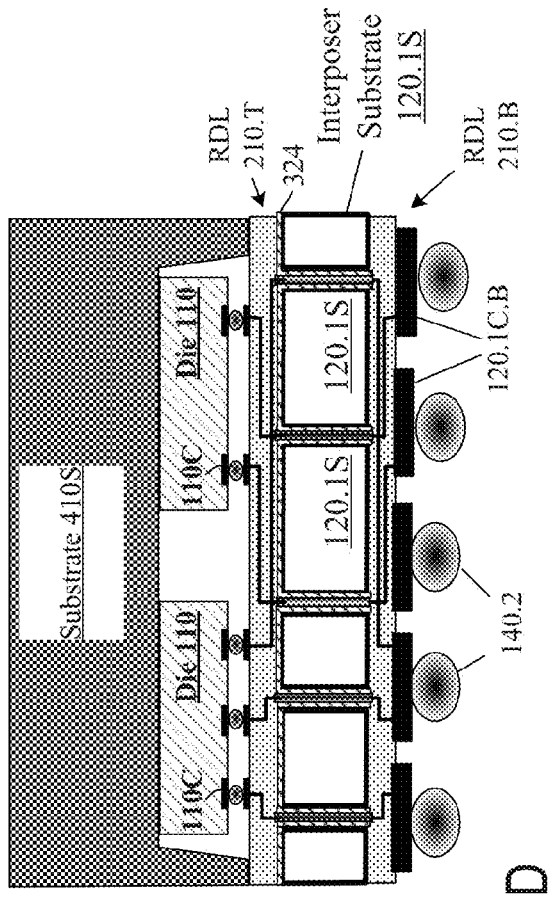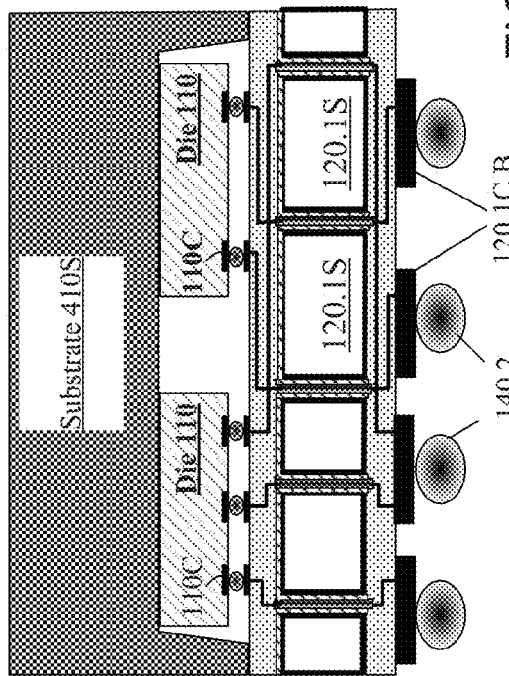
FIG. 5D

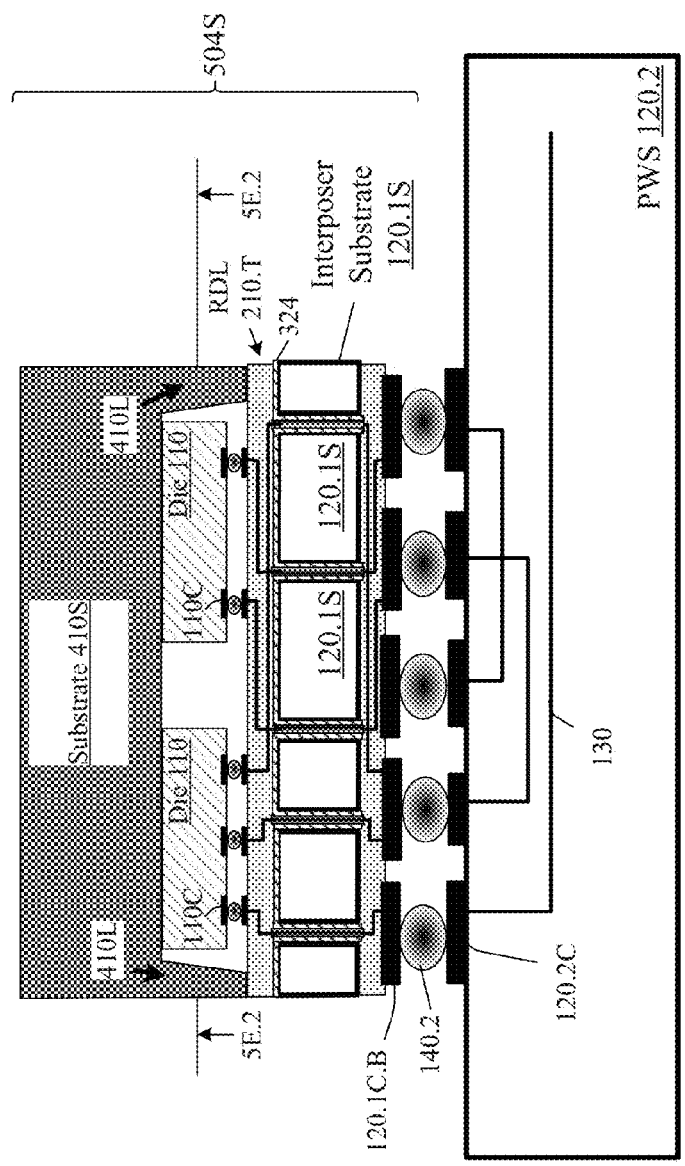
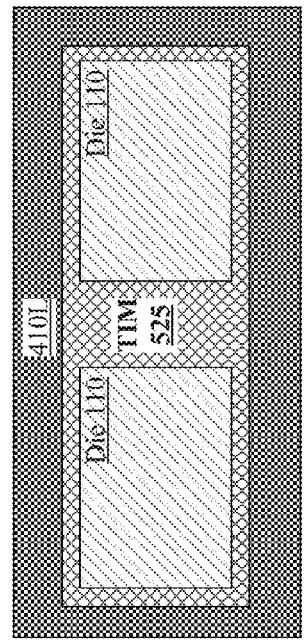
FIG. 5E.1
FIG. 5E.2

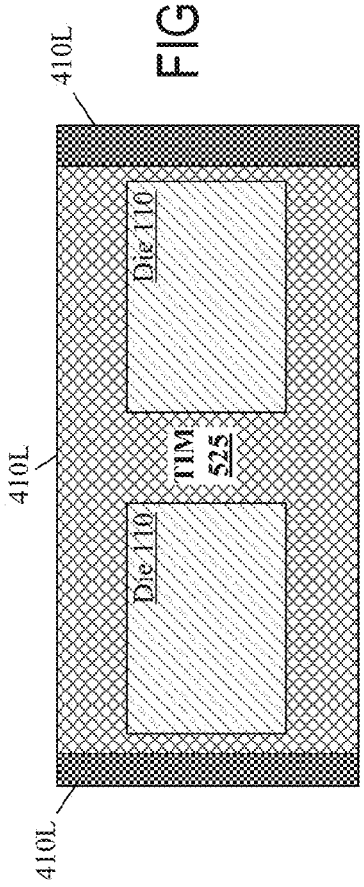
FIG. 5E.3
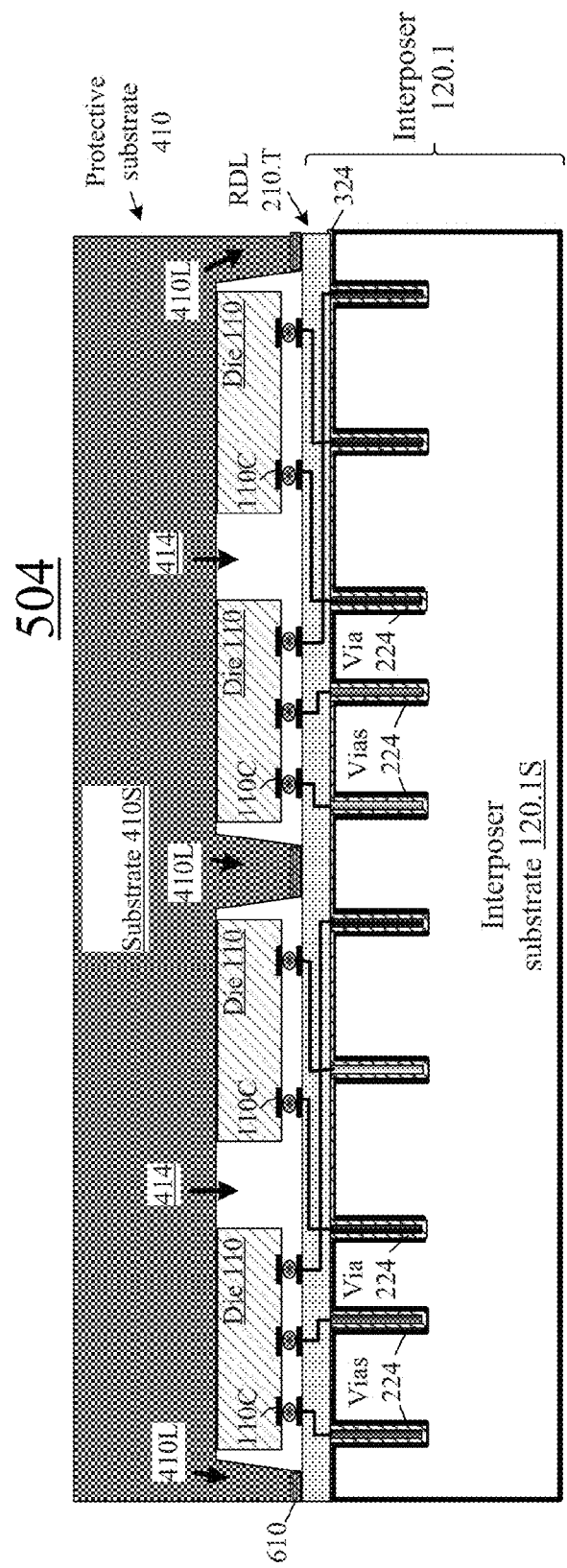
FIG. 6.1

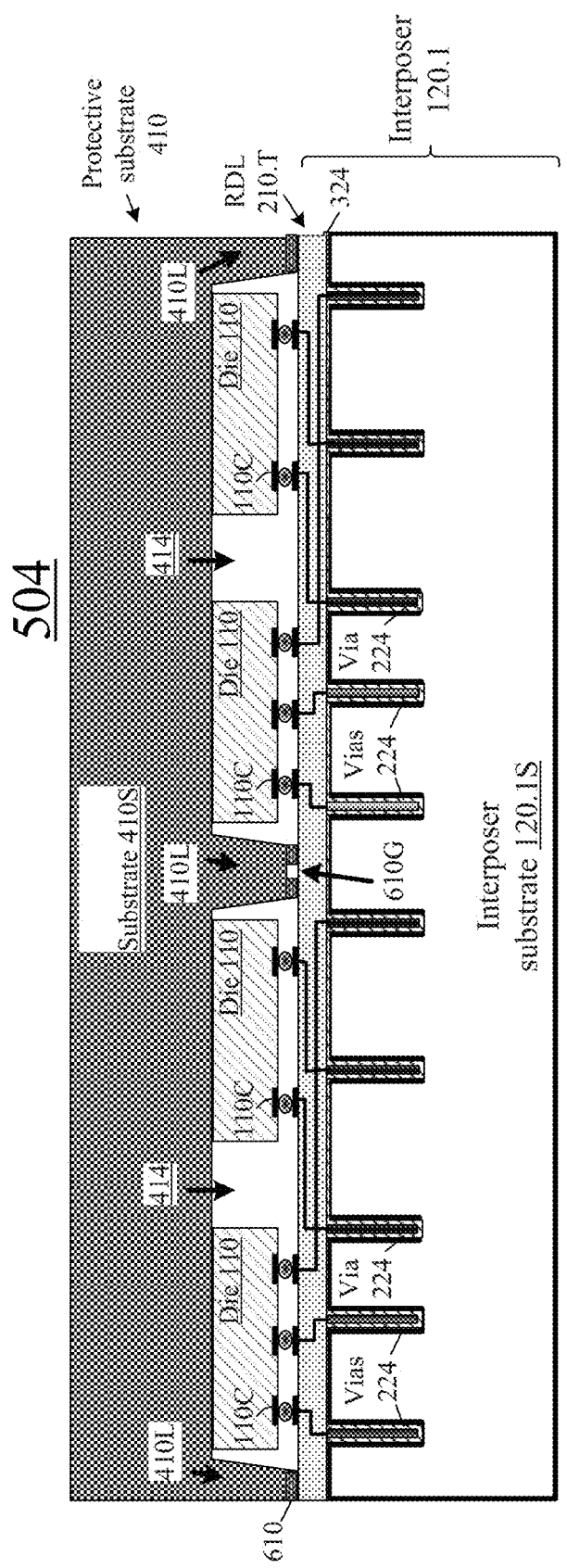
FIG. 6.2

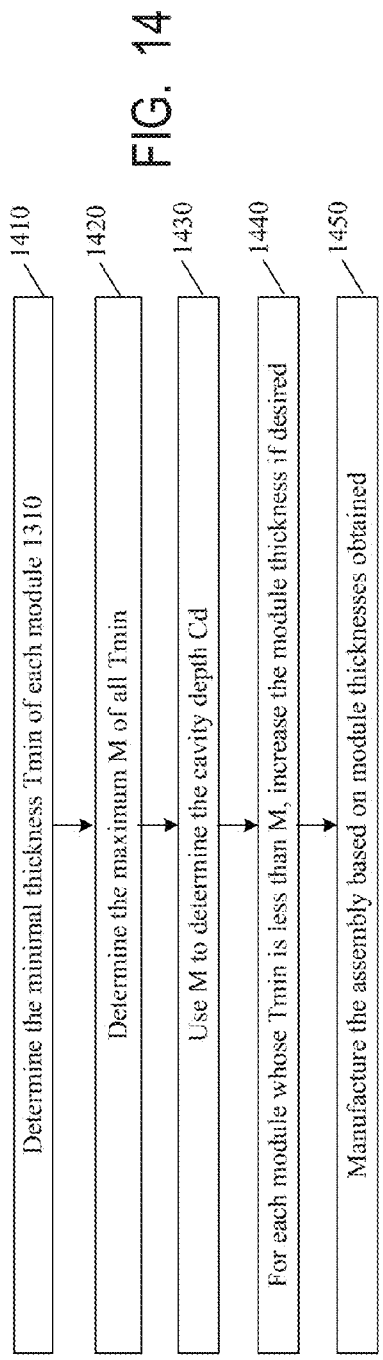
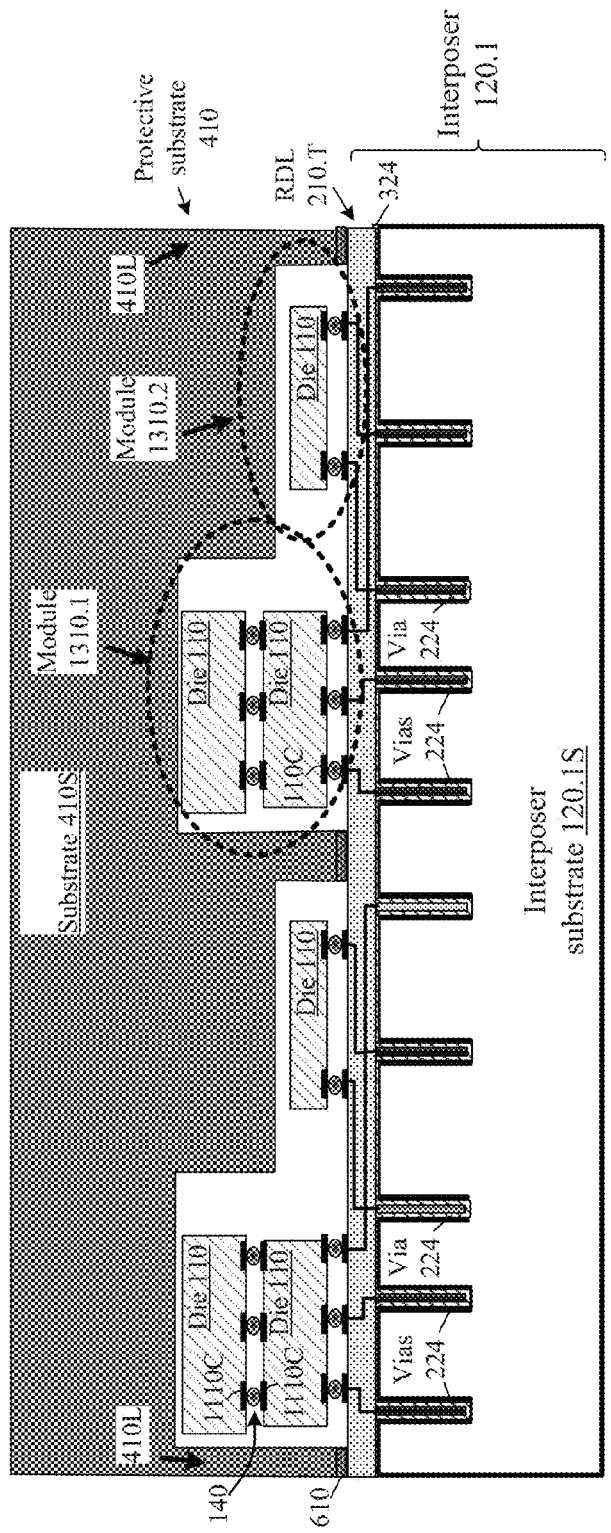

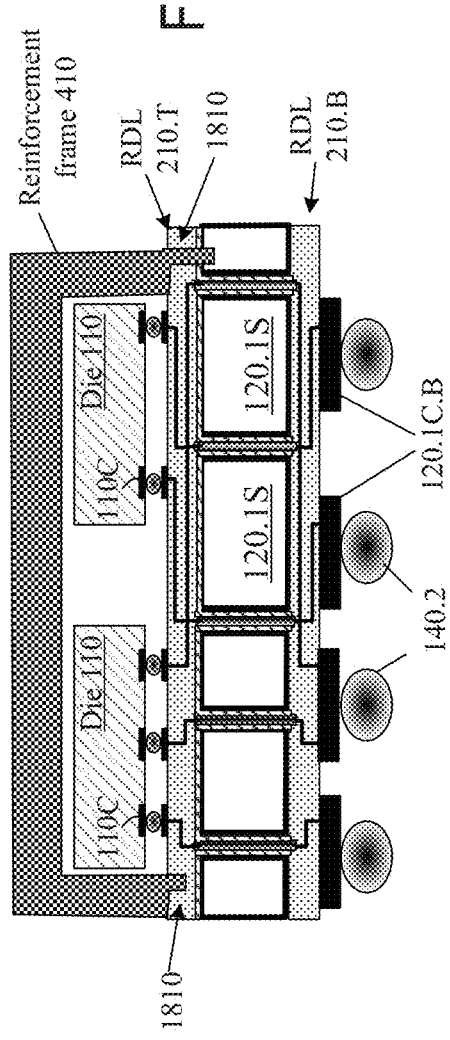
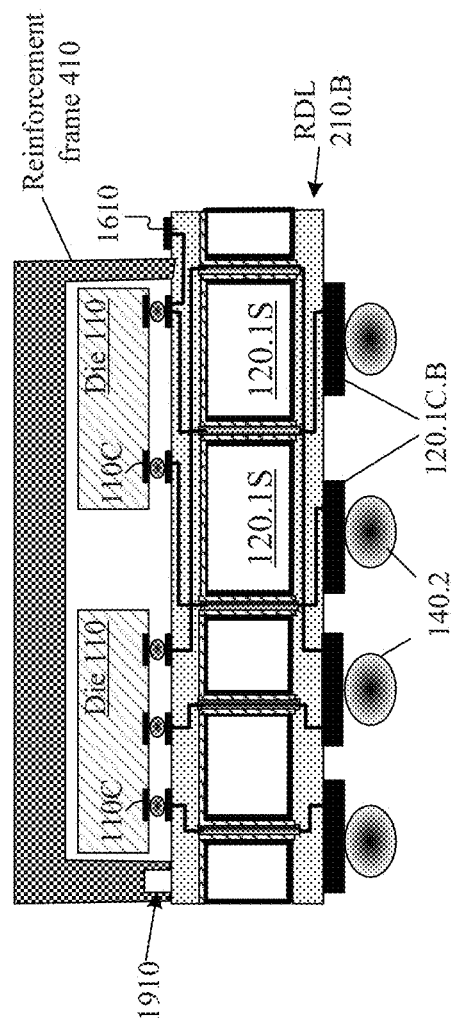

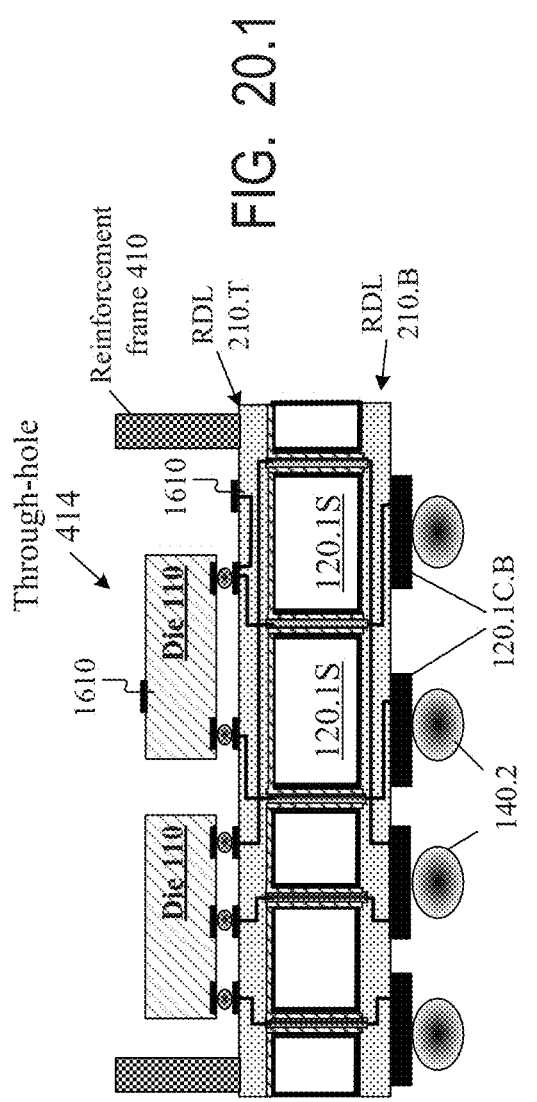
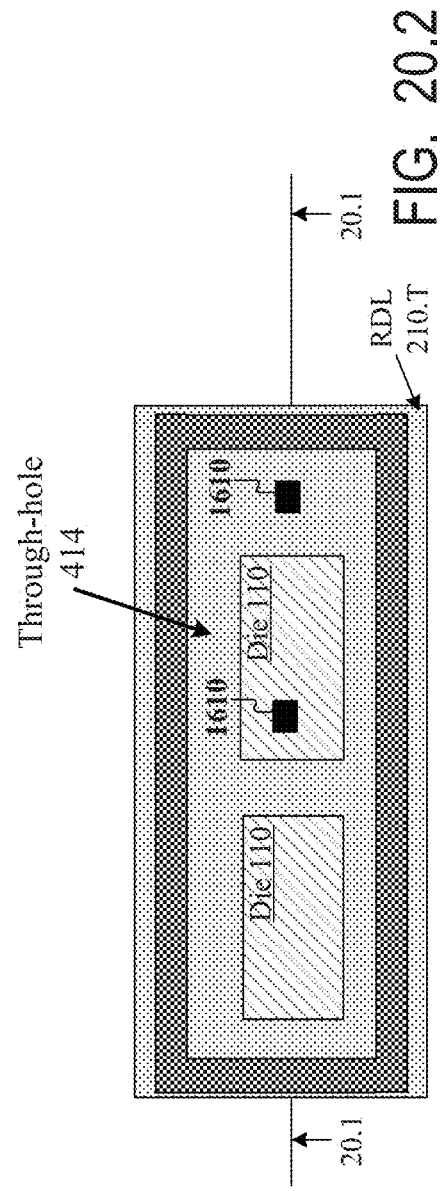

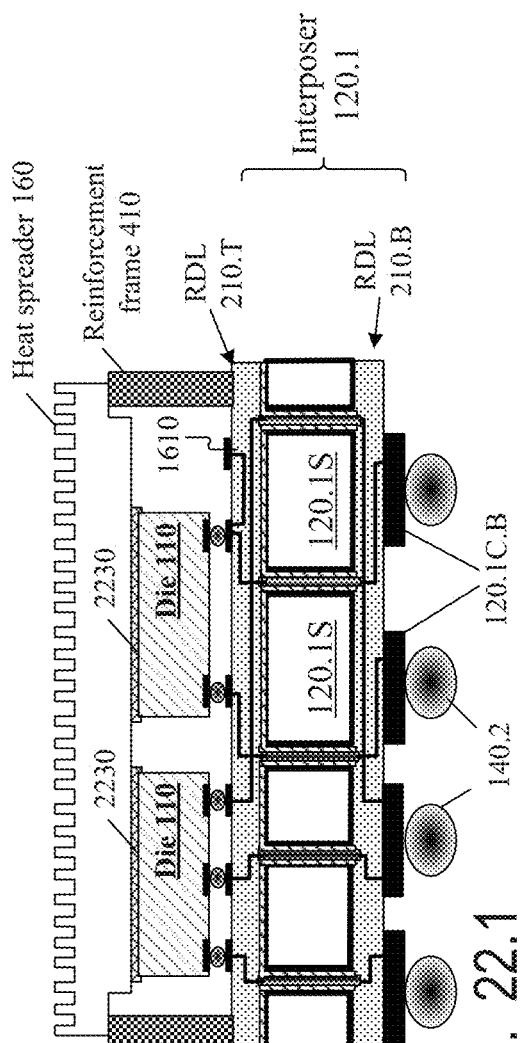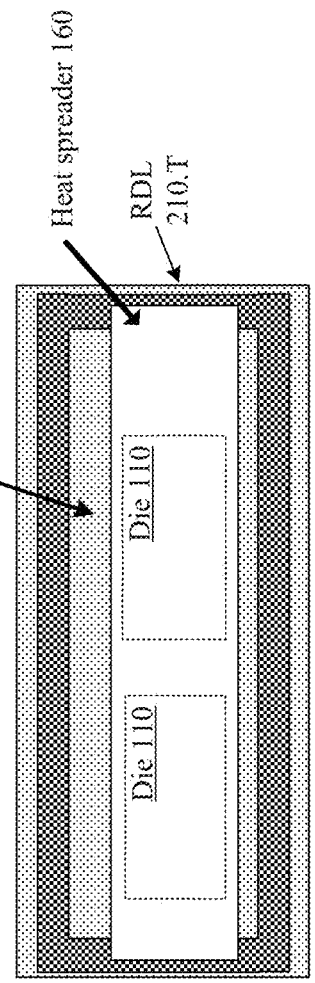

INTEGRATED CIRCUIT ASSEMBLIES WITH REINFORCEMENT FRAMES, AND METHODS OF MANUFACTURE

CROSS-REFERENCE TO RELATED APPLICATIONS

The present application is a continuation-in-part of U.S. patent application Ser. No. 14/214,365, filed 14 Mar. 2014 by Shen et al., titled "INTEGRATED CIRCUITS PROTECTED BY SUBSTRATES WITH CAVITIES, AND METHODS OF MANUFACTURE", incorporated herein by reference, which claims priority of U.S. provisional application No. 61/952,066 filed on Mar. 12, 2014, titled "INTEGRATED CIRCUITS PROTECTED BY SUBSTRATES WITH CAVITIES, AND METHODS OF MANUFACTURE", incorporated herein by reference. The present application also claims priority of the aforementioned provisional application No. 61/952,066.

BACKGROUND

This document relates to integrated circuits, and more particularly to assemblies having dies that include semiconductor integrated circuits.

In fabrication of integrated circuits, one or more circuits are manufactured in a semiconductor wafer and are then separated into "dies" (also called "chips") in a process called "singulation" or "dicing". The dies, such as shown at 110 in FIG. 1, are attached to a wiring substrate ("WS", e.g. printed wiring board) 120 which has conductive lines 130 connecting the dies to each other and to other elements of the system. More particularly, the dies have contact pads 110C connected to the dies' circuits (not shown), and these contact pads are attached to contact pads 120C of WS 120. Pads 120C are interconnected by conductive lines 130. The attachment of pads 110C to pads 120C is performed by connections 140 which may include solder, conductive epoxy, or other types.

Encapsulant 150 (e.g. epoxy with silica or other particles) protects the dies 110 and the connections 140 from moisture and other contaminants, ultraviolet light, alpha particles, and possibly other harmful elements. The encapsulant also strengthens the die-to-WS attachment against mechanical stresses, and the encapsulant helps conduct heat away from the dies (to an optional heat sink 160 or directly to the ambient (e.g. air)). However, the encapsulant can cause warpage if the encapsulant's thermal expansion coefficient (CTE) does not match the CTE of the dies or the WS.

The wiring substrate can be an interposer, i.e. an intermediate substrate used to accommodate a mismatch between die fabrication technology and printed wiring substrates (PWS). More particularly, the die's contact pads 110C can be placed much closer to each other (at a smaller pitch) than PWS pads 120C. Therefore (FIG. 2), an intermediate substrate 120.1 can be used between the dies 120 and the PWS (shown at 120.2). Interposer 120.1 includes a substrate 120.1S (e.g. semiconductor or other material), a redistribution layer (RDL) 210.T on top of substrate 120.1S, and another redistribution layer 210.B on the bottom of substrate 120.1S. Each RDL 210.T, 210.B includes interconnect lines 216 insulated from each other and from substrate 120.1S by the RDL's dielectric 220. Lines 216 are connected to contact pads 120.1C.T on top of the interposer and contact pads 120.1C.B on the bottom. Lines 216 of RDL 210.T are connected to lines 216 of RDL 210.B by conductive (e.g. metallized) through-vias 224. Pads 120.1C.T are attached to the dies' pads 110C by connections 140.1 as in FIG. 1. Pads 120.1C.B are attached to pads 120.2C of PWS 120.2 by connections 140.2. Pads 120.1C.B are at a larger pitch than pads 120.1C.T, to accommodate the pitch of the PWS contacts 120.2C.

The interposer substrate 120.1S should be as thin as possible to shorten the signal paths between dies 110 and PWS 120.2 and thus make the system faster and less power hungry. Also, if the interposer is thin, fabrication of metallized vias 224 is facilitated. However, thin interposers are hard to handle: they are brittle, easily warped, and do not absorb or dissipate heat during fabrication. Therefore, a typical fabrication process attaches the interposer to a temporary substrate ("support wafer") during fabrication. The support wafer is later removed. Attaching and detaching temporary support wafers is burdensome, and should be avoided if possible. See U.S. Pat. No. 6,958,285 issued Oct. 25, 2005 to Siniaguine.

It is desirable to provide improved protection of dies from mechanical stresses, heat, and harmful elements, and improved accommodations for thin interposers.

SUMMARY

This section summarizes some of the exemplary implementations of the invention.

In some embodiments, the dies are protected by a reinforcement frame which is a separate substrate attached to a wiring substrate. The dies are located in openings in the reinforcement frame. Each opening may be a cavity, a through-hole, or both (i.e. a cavity with one or more through-holes). In some cavity embodiments, the reinforcement frame is similar to cap wafers used to protect MEMS components (Micro-Electro-Mechanical Structures); see K. Zoschke et al., "Hermetic Wafer Level Packaging of MEMS Components Using Through Silicon Via and Wafer to Wafer Bonding Technologies" (2013 Electronic Components & Technology Conference, IEEE, pages 1500-1507); see also U.S. Pat. No. 6,958,285 issued Oct. 25, 2005 to Siniaguine. However, in some embodiments, the reinforcement frame improves heat dissipation from the dies, and may reduce or eliminate the need for encapsulant. In some embodiments (e.g. those with through-holes), reinforcement frames allow much flexibility for fabrication sequences and intermediate testing during manufacturing. A reinforcement frame may or may not have its own circuitry connected to the dies or to the wiring substrate.

In some embodiments, an opening contains multiple dies.

The invention is not limited to the features and advantages described above, and includes other features described below.

BRIEF DESCRIPTION OF THE DRAWINGS

FIGS. 3A, 3B, 3C, 3D, 3E, 4A, 4B, 4C, 5A, 5B, 5C, 5D, 5E.1 illustrate vertical cross-sections of structures according to some embodiments as set forth in detail below.

FIGS. 5E.2 and 5E.3 are bottom views of horizontal cross sections according to some embodiments as set forth in detail below.

FIGS. 6.1, 6.2, 7, 8A, 8B, 8C, 9A, 9B, 9C, 9D, 10, 11, 12, 13A, 13B illustrate vertical cross-sections of structures according to some embodiments as set forth in detail below.

FIG. 14 is a flowchart of a design and manufacturing method for manufacturing of assemblies according to some embodiments as set forth in detail below.

FIGS. 15A, 15B, 16, 17, 18, 19, 20.1 illustrate vertical cross-sections of structures according to some embodiments as set forth in detail below.

FIGS. 20.2, 21 are top views of assemblies according to some embodiments as set forth in detail below.

FIG. 22.1 illustrates a vertical cross-section of assemblies according to some embodiments as set forth in detail below.

FIG. 22.2 is a top view of assemblies according to some embodiments as set forth in detail below.

DESCRIPTION OF SOME EMBODIMENTS

Figure 1:
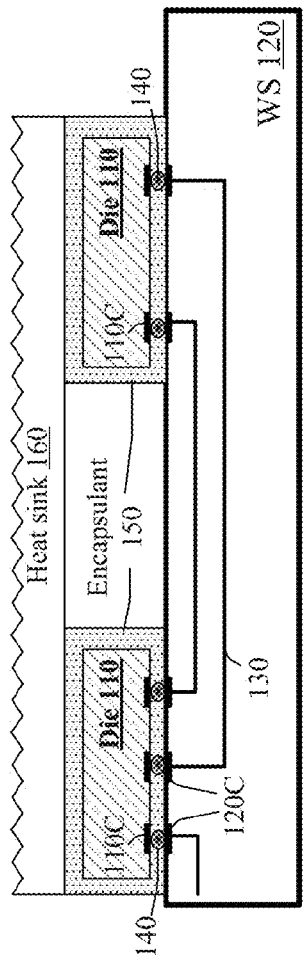
FIGS. 1 and 2 illustrate vertical cross-sections of assemblies including integrated circuits and constructed according to prior art.

The embodiments described in this section illustrate but do not limit the invention. In particular, the invention is not limited to particular materials, processes, dimensions, or other particulars except as defined by the appended claims.

FIG. 3A shows the beginning stages of fabrication of an interposer 120.1 according to some embodiments of the present invention. The interposer substrate 120.1S is initially chosen to be sufficiently thick to provide easy handling and adequate heat dissipation in fabrication. In some embodiments, substrate 120.1S is a monocrystalline silicon wafer of a 200 mm or 300 mm diameter and a thickness of 650 micron or more. These materials and dimensions are exemplary and do not limit the invention. For example, substrate 120.1S can be made of other semiconductor materials (e.g. gallium arsenide), or glass, or sapphire, or metal, or possibly other materials. Possible materials include NbTaN and LiTaN. The substrate will later be thinned; for example, in case of silicon, the final thickness could be 5 to 50 microns. Again, these dimensions are not limiting.

Substrate 120.1S is patterned to form blind vias 224B (FIG. 3B). "Blind" means that the vias do not go through substrate 120.1S. This can be done, for example, as follows for silicon substrates. First, optional layer 310 (FIG. 3A) is formed on substrate 120.1S to protect the substrate and/or improve the adhesion of subsequently formed photoresist 320. For example, layer 310 can be silicon dioxide formed by thermal oxidation, chemical vapor deposition (CVD), or sputtering. Then photoresist 320 is deposited and photolithographically patterned to define the vias. Layer 310 and substrate 120.1S are etched in areas exposed by resist 320 to form the blind vias. The via depth is equal or slightly greater than the final depth of substrate 120.1S, e.g. 5 to 51 microns for some silicon-substrate embodiments. The vias can be formed by a dry etch, e.g. dry reactive ion etching (DRIE). An exemplary diameter of each via can be 60 microns or less, but other dimensions are possible. The vias can be vertical (as shown) or may have sloped sidewalls. As noted above, the particular dimensions, processes and other features are illustrative and not limiting. For example, the vias can be laser-drilled or made by some other process.

The vias are then metallized. If substrate 120.1S is silicon, this can be done as follows. Photoresist 320 and protective layer 310 are removed, and a dielectric layer 324 (FIG. 3C) is formed on the entire top surface of substrate 120.1S. Dielectric 324 lines the via surfaces. In some embodiments, dielectric 324 is formed by thermal oxidation of the silicon substrate or by CVD or physical vapor deposition (PVD). Dielectric 324 will electrically insulate the substrate from subsequently formed metal in vias 224B. The dielectric thickness depends on the desired process parameters, and is 1 micron in an exemplary thermal-oxide embodiment (a thermal oxide is silicon dioxide formed by thermal oxidation). Other dimensions and materials can be used instead. Dielectric 324 can be omitted if substrate 120.1S is itself dielectric.

Then metal 224M (FIG. 3D) is formed in vias 224B over the dielectric 324. In the embodiment shown, metal 224M fills up the vias, but in other embodiments the metal is a liner on the via surfaces. In an exemplary embodiment, metal 224M is electroplated copper. For example, a barrier layer (metal or dielectric, not shown separately) is formed first on dielectric 324 to aid in copper adhesion and prevent copper diffusion into the dielectric 324 or substrate 120.1S. Suitable barrier layers may include a layer of titanium-tungsten (see Kosenko et al., US pre-grant patent publication 2012/0228778 published Sep. 13, 2012, incorporated herein by reference), and/or nickel containing layers (Uzoh et al., US 2013/0014978 published Jan. 17, 2013, incorporated herein by reference). Then a seed layer, e.g. copper, is formed on the barrier layer by physical vapor deposition (e.g. PVD, possibly sputtering). Then copper is electroplated on the seed layer to fill the vias 224B and cover the whole substrate 120.1S. The copper is then removed from the areas between the vias by chemical mechanical polishing (CMP). Optionally, the CMP may also remove the barrier layer (if present) from these areas, and may stop on dielectric 324. As a result, the copper and the barrier layer remain only in and over the vias 224B.

For ease of description, we will refer to vias 224 as "metallized", but non-metal conductive materials can also be used (e.g. doped polysilicon).

If layer 224M does not fill the vias but is only a liner on the via surfaces, some other material (not shown) can be formed on layer 224M as a filler to fill the vias and provide a planar top surface for the wafer. This filler material can be polyimide deposited by spin coating for example.

Optionally, RDL 210.T (FIG. 3E) is formed on top of substrate 120.1S to provide contact pads 120.1C.T at desired locations. RDL 210.T can be formed by prior art techniques described above in connection with FIGS. 1 and 2 for example. RDL 210.T is omitted if the contact pads 120.1C.T are provided by the top areas of metal 224M. In such a case, if substrate 120.1S is not dielectric, then a dielectric layer can be formed on the substrate and photolithographically patterned to expose the contact pads 120.1C.T.

Interposer 120.1 may include transistors, resistors, capacitors, and other devices (not shown) in substrate 120.1S and redistribution layer 210.T. These devices can be formed before, during and/or after the fabrication of vias 224 and RDL 210.T using the process steps described above and/or additional process steps. Such fabrication techniques are well known. See e.g. the aforementioned U.S. Pat. No. 6,958,285 and pre-grant patent publication 2012/0228778, both incorporated herein by reference.

Dies 110 are attached to contact pads 120.1C.T by connections 140.1, using possibly prior art methods described above in relation to FIGS. 1 and 2 or by other methods (e.g. diffusion bonding; in this case the connections 140.1 are not additional elements but are part of contact pads 110C and/or 120.1C.T).

Optionally, an encapsulant (not shown) can be formed under the dies (as underfill) and/or around the dies (to completely or partially cover the dies' sidewalls), and perhaps above the dies (to completely cover the dies' top and sidewall surfaces), possibly by prior art techniques (e.g. including molding and/or capillary action for underfill). The encapsulant can be any suitable material (e.g. epoxy with silica or other particles). No encapsulant is used in some embodiments. Other embodiments use an encapsulant, but the requirements for the encapsulant are relaxed because the dies will be protected by a reinforcement frame in the form of an additional, protective substrate 410 (FIG. 5A) as described below. In some embodiments, the encapsulant is provided only underneath the dies (as underfill), i.e. only between the dies and substrate 120.1S (around the connections 140.1).

Figure 4B:
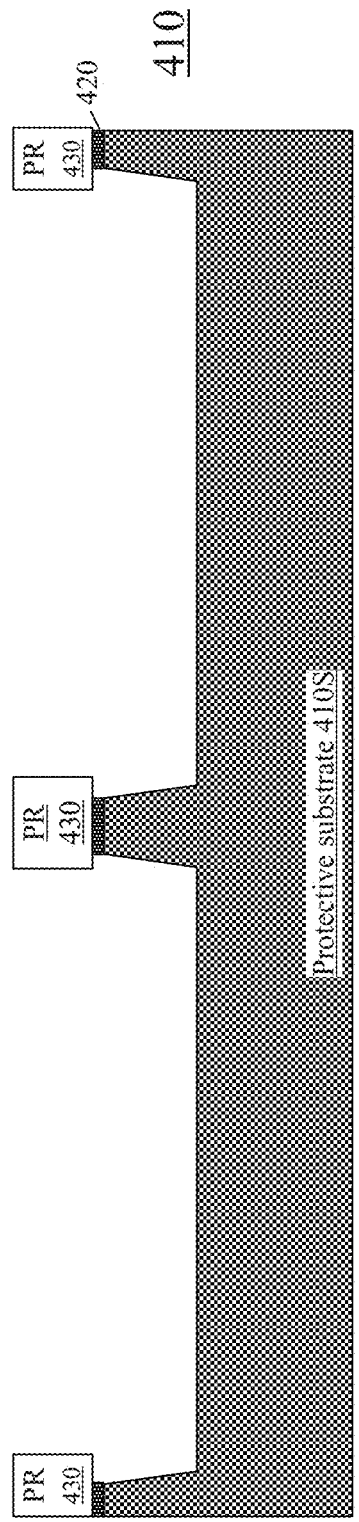
Figure 4C:
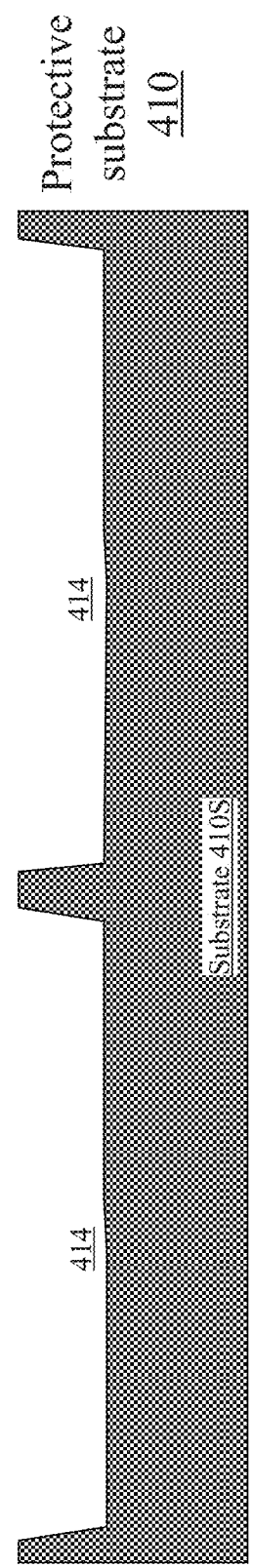

FIGS. 4A-4C illustrate fabrication of protective substrate 410. Many variations are possible. Substrate 410 should be sufficiently rigid to facilitate subsequent handling of the assembly as explained below. In the embodiment shown, substrate 410 includes monocrystalline silicon substrate 410S of a thickness 650 microns or higher. Other materials (e.g. glass, metal, polymer plastic, and others) and thicknesses are possible, based on any factors that may be important (including the availability of materials and processes). One possible factor is reducing the mismatch of the coefficients of thermal expansion (CTE) between substrates 410 and 120.1S: if substrate 120.1S is silicon, then substrate 410S could be silicon or another material with a similar CTE. Another factor is reducing the CTE mismatch between substrate 410 and dies 110 (especially if the dies may physically contact the substrate 410 or may be attached to substrate 410). In some embodiments, substrate 410S will not have any circuitry, but if circuitry is desired in or on substrate 410S then this may affect the choice of material. The circuitry can be fabricated before, and/or during, and/or after the steps described below.

Another possible factor is high thermal conductivity to enable the substrate 410 to act as a heat sink. For example, metal may be appropriate.

Openings 414 (FIG. 4C) are cavities formed in substrate 410 to match the size and position of dies 110. An exemplary process is as follows (this process is appropriate for a silicon substrate 410S, and may be inappropriate for other materials; known processes can be used for silicon or other materials). First, an auxiliary layer 420 (FIG. 4A) is formed to cover the substrate 410S for protection or for improved adhesion of subsequently formed photoresist 430. Resist 430 is then deposited and patterned photolithographically to define the cavities 414. Auxiliary layer 420 exposed by the resist openings is etched away. Then (FIG. 4B) substrate 410S is etched in these openings to form cavities 414 with sloped, upward-expanding sidewalls (e.g. by a wet etch). The cavity depth depends on the thickness of dies 110 and connections 140.1 as explained below. Non-sloped (vertical) sidewalls can also be obtained, by an anisotropic dry etch for example. Retrograde sidewalls or other sidewall profiles are also possible.

Then photoresist 430 is removed (FIG. 4C). In the example shown, auxiliary layer 420 is also removed, but in other embodiments layer 420 remains in the final structure.

As shown in FIG. 5A, substrate 410 is attached to interposer 120.1 so that one or more dies 110 fit into a corresponding cavity 414. More particularly, legs 410L of protective substrate 410 are attached to the top surface of interposer 120.1 (e.g. to RDL 210.T if the RDL is present; legs 410L are those portion(s) of protective substrate 410 that surround the cavities). The substrate-to-interposer attachment is shown as direct bonding, but other types of attachments (e.g. by adhesive) can also be used as described further below. The entire assembly is marked with numeral 504.

In FIG. 5A, the dies' top surfaces physically contact the top surfaces of cavities 414. In some embodiments, each die's top surface is bonded to the cavity top surface (directly or in some other way, e.g. by adhesive). This bonding increases the bonding strength between the two substrates and improves the thermal conductivity of the thermal path from the dies to the protective substrate. In other embodiments, the dies are not bonded to substrate 410, and may be spaced from substrate 410. Air or thermal interface material (TIM, possibly gel-like) may at least partially fill the space between the dies and the cavities' top surfaces; for example, TIM could physically contact the dies and the cavity top surfaces to improve heat conduction away from the dies.

In other embodiments, the dies are not bonded to the cavities' top surfaces, and thus the dies' top surfaces can slide laterally along the cavities' top surfaces in thermal movement. This may reduce the thermal stresses, e.g. if the die-interposer CTE matching is better than the matching between the interposer and protective substrate 410.

Figure 2:
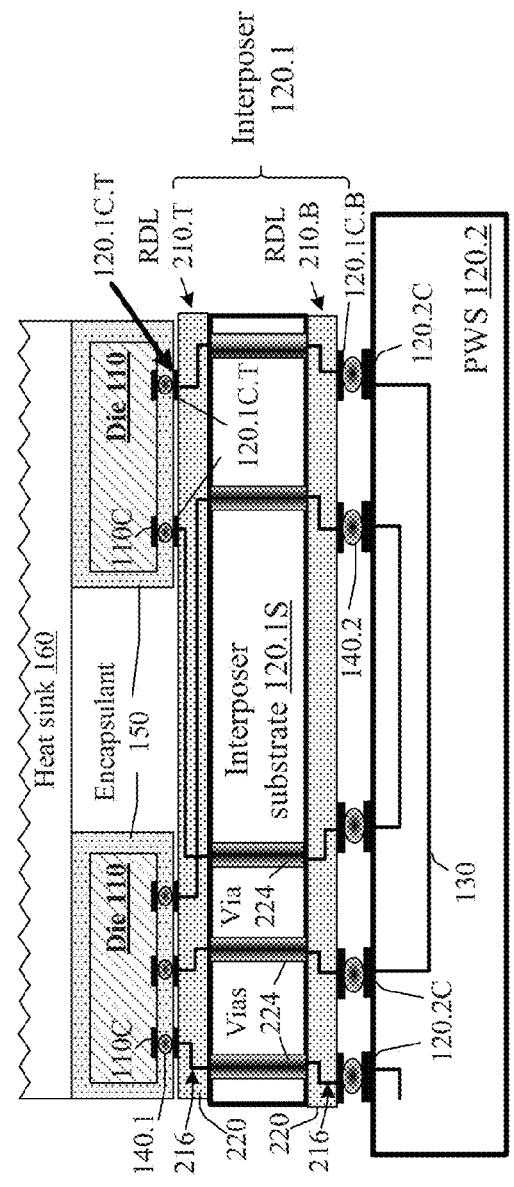

As noted above, in some embodiments the dies are underfilled and/or encapsulated from above by a suitable protective material (not shown in FIG. 5A), e.g. the same material as in FIG. 1. In case of encapsulation from above, the cured encapsulant may be a solid material (possibly thermosetting) physically contacting the top surfaces of cavities 414. The encapsulant may or may not be bonded to the cavity surfaces as described above, with benefits similar to those described above for the no-encapsulant embodiments.

To ensure physical contact between the dies (or the encapsulant) and the cavities, the top surfaces of the dies (or encapsulant) should have uniform height. To improve the height uniformity, the dies (or encapsulant) can be polished before joining of substrate 410 to interposer 120.1. Suitable polishing processes include lapping, grinding, and chemical mechanical polishing (CMP). Also, before inserting the dies into cavities, the cavity surfaces and/or the dies can be provided with a suitable temperature interface material (TIM, not shown here but shown at 525 in FIGS. 5E.2 and 5E.3 discussed below) to improve the thermal transfer between the dies and substrate 410. TIM's thermal conductivity can usually be higher than that of air. Exemplary TIMs are those that exist in semisolid, gel-like (grease-like) state throughout the range of expected operating temperatures (e.g. 0° C. to 200° C. for some assemblies) or at least when the temperatures are high to make die cooling particularly desirable (20° C. to 200° C. for some assemblies). The gel-like materials fill free spaces between the dies and substrate 410 to provide a thermally conductive path away from the dies. An exemplary TIM material is a thermal grease available from Arctic Silver, Inc. (having an office in California, USA); the grease's thermal conductivity is 1 W/mK.

After the bonding of substrate 410 to interposer 120.1, the interposer is thinned from the bottom to expose the metal 224M (FIG. 5B). The thinning involves partial removal of substrate 120.1S and dielectric 324 (if the dielectric is present). The thinning may be performed by known techniques (e.g. mechanical grinding or lapping of substrate 120.1S followed by dry or wet, masked or unmasked etch of substrate 120.1S and dielectric 324; the substrate and the dielectric are etched simultaneously in some embodiments.) In some embodiments, dielectric 324 protrudes out of substrate 120.1S around metal 224M at the end of the thinning operation, and metal 224M protrudes out of the dielectric. See for example the aforementioned U.S. Pat. No. 6,958,285. As noted above, the invention is not limited to particular processes.

Advantageously, interposer 120.1 is kept flat by substrate 410, so the handling of the assembly 504 is facilitated. Substrate 410 also improves mechanical integrity (e.g. increases rigidity and weight) to further facilitate handling of the assembly. Also, substrate 410 helps absorb and dissipate the heat generated during this and subsequent fabrication stages and in subsequent operation of assembly 504. The final thickness of substrate 120.1S can therefore be very low, e.g. 50 microns or even 5 microns or less. Hence, blind vias 224B (FIG. 3B) can be shallow. The shallow depth facilitates fabrication of the metallized vias (i.e. facilitates the via etch and subsequent deposition of dielectric and metal into the vias). The shallow depth also shortens the signal paths through the vias. Moreover, if the vias are shallow, each via can be narrower while still allowing reliable dielectric and metal deposition. The via pitch can therefore be reduced.

If desired, protective substrate 410 can be thinned from the top (this is not shown in FIG. 5B). The combined thickness of substrates 120.1S and 410 is defined by desired properties, such as rigidity, resistance to warpage, heat dissipation, and assembly size. In some embodiments, substrate 410 is thinned to remove the substrate portions over the dies 110 and to leave only the legs 410L, thus obtaining a structure of a type described below in relation to FIG. 20.1.

Figure 5C:
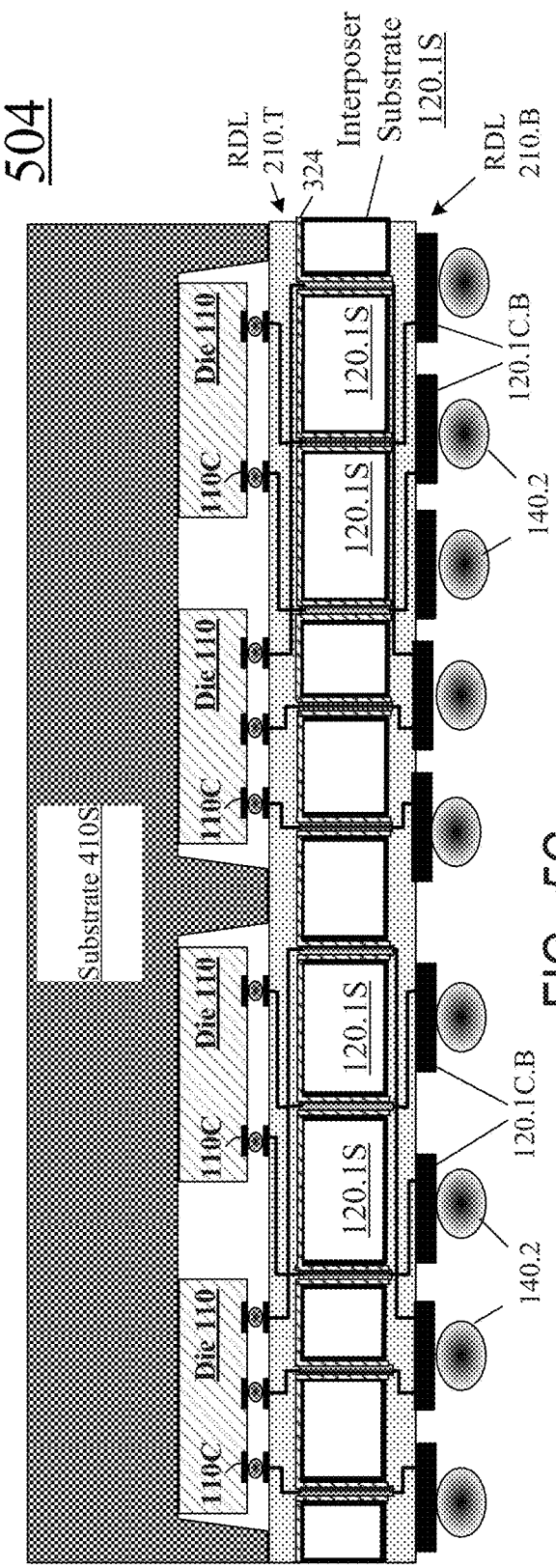

Subsequent process steps depend on the particular application. In some embodiments (FIG. 5C), RDL 210.B is formed on the bottom of substrate 120.1S, possibly using prior art techniques (as in FIG. 2 for example). The RDL provides contact pads 120.1C.B and connects them to metal 224M. (If the RDL is omitted, the contact pads are provided by metal 224M). If desired, the assembly 504 can be diced into stacks 504S (FIG. 5D). Then the stacks (or the entire assembly 504 if dicing is omitted) are attached to other structures, such as wiring substrate 120.2 (e.g. a printed wiring substrate) in FIG. 5E.1. In the example of FIG. 5E.1, a stack 504S is attached to PWS 120.2, and more particularly the stack's contacts 120.1C.B are attached to PWS contacts 120.2C, possibly by the same techniques as in FIG. 1 or 2. Conductive lines 130 of PWS 120.2 connect the contact pads 120.2C to each other or other elements. These details are not limiting.

FIG. 5E.2 shows a possible bottom view of the horizontal cross section along the line 5E.2-5E.2 in FIG. 5E.1. In the example of FIG. 5E.2, the dies are surrounded by temperature interface material (TIM) 525. The legs 410L form a region completely surrounding each cavity, and the interposer area bonded to the legs also completely surrounds each cavity.

FIG. 5E.3 shows another possible bottom view of the same horizontal cross section, also with TIM 525. In this example, the legs 410L are provided only on two opposite sides of each cavity (left and right sides) but are not provided above and below. Each cavity 414 is a horizontal groove in substrate 410S, containing multiple dies (a groove may also have only one die). The groove may run through the entire substrate. Other cavity shapes are also possible.

As noted above, protective substrate 410 and interposer 120.1 can be bonded by adhesive, and FIG. 6.1 illustrates such bonding by adhesive 610. Adhesive 610 is provided on legs 140L or the corresponding areas of interposer 120.1 or both. The structure is shown at the stage of FIG. 5A (before interposer thinning). In some embodiments, the adhesive is elastic, with a low elasticity modulus (e.g. silicone rubber with elasticity modulus of 50 MPa), to help absorb any mismatches in the thermal expansion of dies 110 and/or substrate 410 and/or interposer 120.1 (e.g. so that the pressure from the expanding dies 110 would not damage the protective substrate 410 or the dies). In some embodiments, this is beneficial if the dies' CTE is equal to or greater than the CTE of protective substrate 410 or substrate 410S. The adhesive's elasticity also absorbs the height non-uniformity of the top surfaces of dies 110 or the top surfaces of cavities 414. Also, to absorb the dies expansion, the adhesive may have a CTE equal to or greater than the dies' CTE. Exemplary adhesives are epoxy-based underfills.

In some embodiments, adhesive 610 is a punched adhesive tape.

FIG. 6.2 illustrates a similar embodiment where the adhesive is not present in areas 610G in which the structure will be diced.

Figure 7:
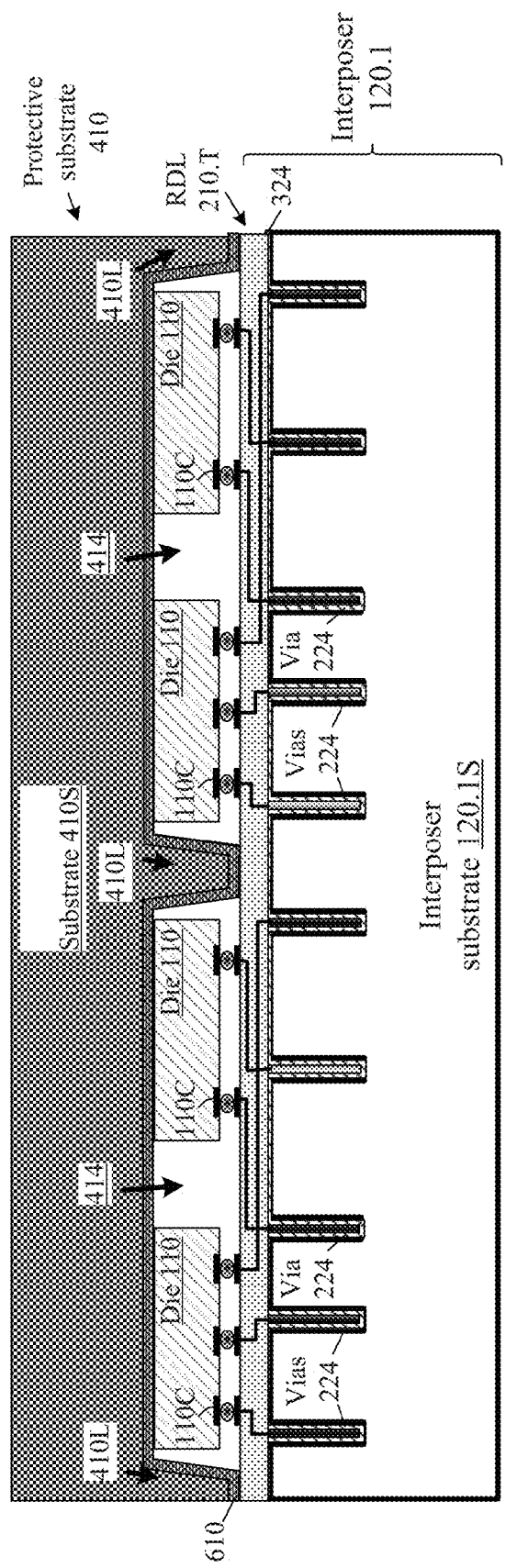

FIG. 7 shows a similar embodiment, but the adhesive 610 covers the whole bottom surface of protective substrate 410S. The adhesive bonds the dies' (or encapsulant's) top surfaces to the top surfaces of the cavities. The adhesive's CTE can be equal to, or greater than, or less than, the dies' CTE.

Figure 8A:
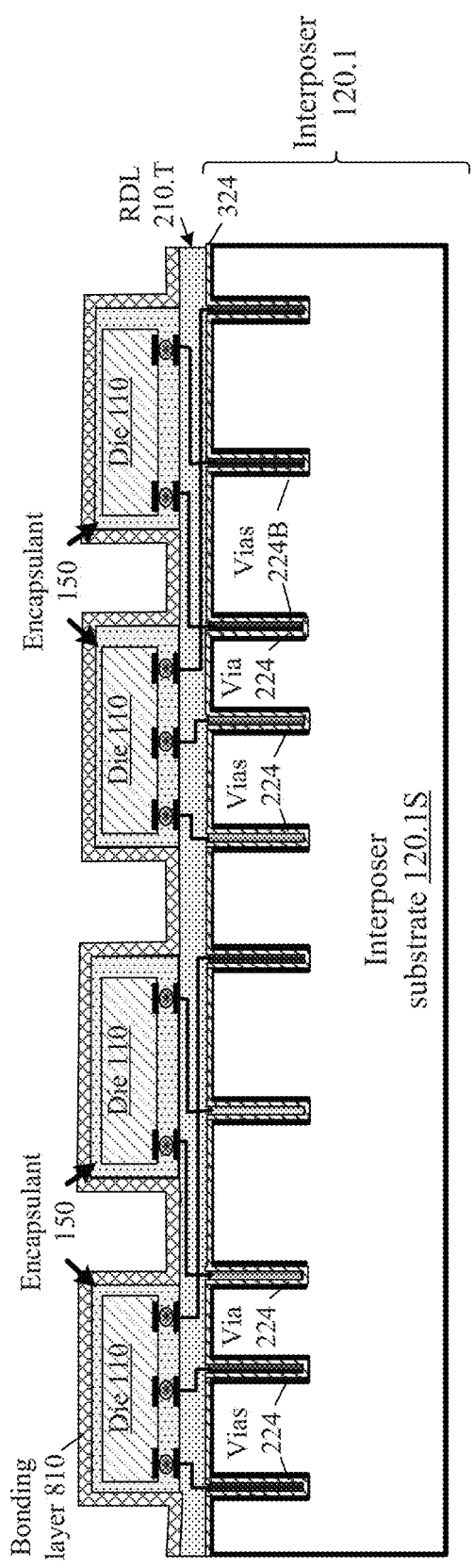
Figure 8B:
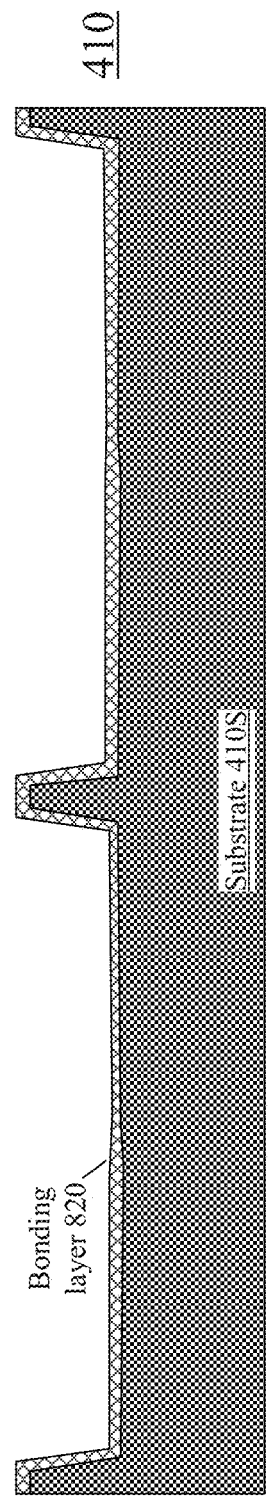
Figure 8C:
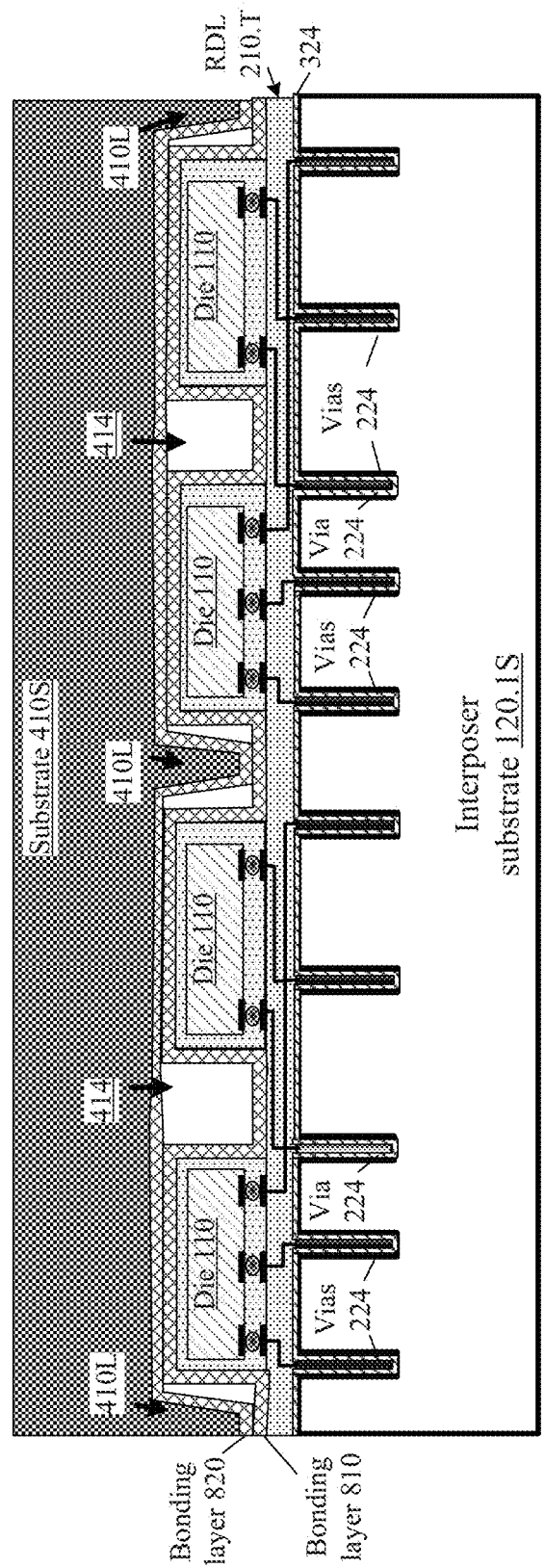

FIGS. 8A-8C illustrate the use of separate bonding layers 810, 820 to directly bond the protective substrate 410 to interposer 120.1. In some embodiments, the bonding layers are silicon dioxide, but other materials can also be used (e.g. metals for eutectic bonding). Referring to FIG. 8A, the dies are attached to interposer 120.1 as in FIG. 3E; the dies are then optionally underfilled and/or encapsulated from above (in FIG. 8A, encapsulant 150 encapsulates and underfills the dies). Bonding layer 810, e.g. silicon dioxide or metal, is formed to cover the interposer and the dies (and the encapsulant if present), by any suitable techniques (e.g. sputtering).

Referring to FIG. 8B, the protective substrate 410 is provided with cavities as in FIG. 4C. Then a bonding layer 820, e.g. silicon dioxide or metal, is formed to cover the substrate surface by any suitable techniques (e.g. sputtering, or thermal oxidation if substrate 410S is silicon).

Referring to FIG. 8C, the interposer is joined to substrate 410 so that the layers 810, 820 physically contact each other. The structure is then heated to bond the layer 820 to layer 810 where the two layers meet, i.e. at legs 410L and at the cavities' top surfaces. In some embodiments however, before the bonding, the layer 820 is removed at the cavities' top surfaces not to bond the dies to the cavities' top surfaces.

Subsequent processing of the structures of FIGS. 6.1-8A (interposer thinning, possible dicing, etc.) can be as described above for other embodiments.

The process step sequences described above are not limiting; for example, the vias 224 can be formed after the interposer thinning FIGS. 9A-9D illustrate an exemplary process. Interposer 120.1 is fabricated essentially as in FIG. 3E or 6.1 or 6.2 or 8A, but without vias 224 (the vias will be formed later). In particular, dielectric 324 is a flat layer on interposer substrate 120.1S. Then contact pads 910 are formed on substrate 120.1S at the locations of future vias 224. RDL 210.T is optionally fabricated on top of the interposer to connect the contact pads 910 to pads 120.1C.T on top of the interposer. (Alternatively, the pads 120.1C.T can be provided by pads 910.) Dies 110 are attached to pads 120.1C.T, and optionally underfilled and encapsulated. Bonding layer 810 (as shown) is optionally deposited as in FIG. 8A for bonding to the protective substrate (alternatively, the bonding can be by an adhesive as in FIG. 6.1 or 6.2 or 7, or by a direct bonding process as described above in relation to FIG. 5A).

Figure 9A:
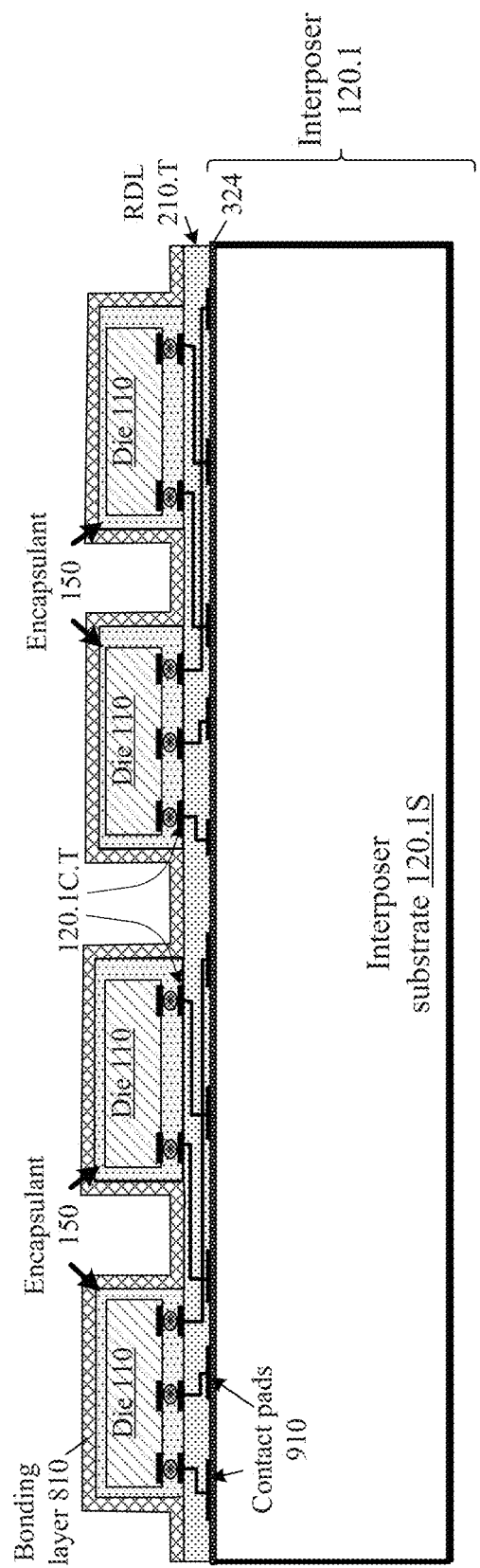
Figure 9B:
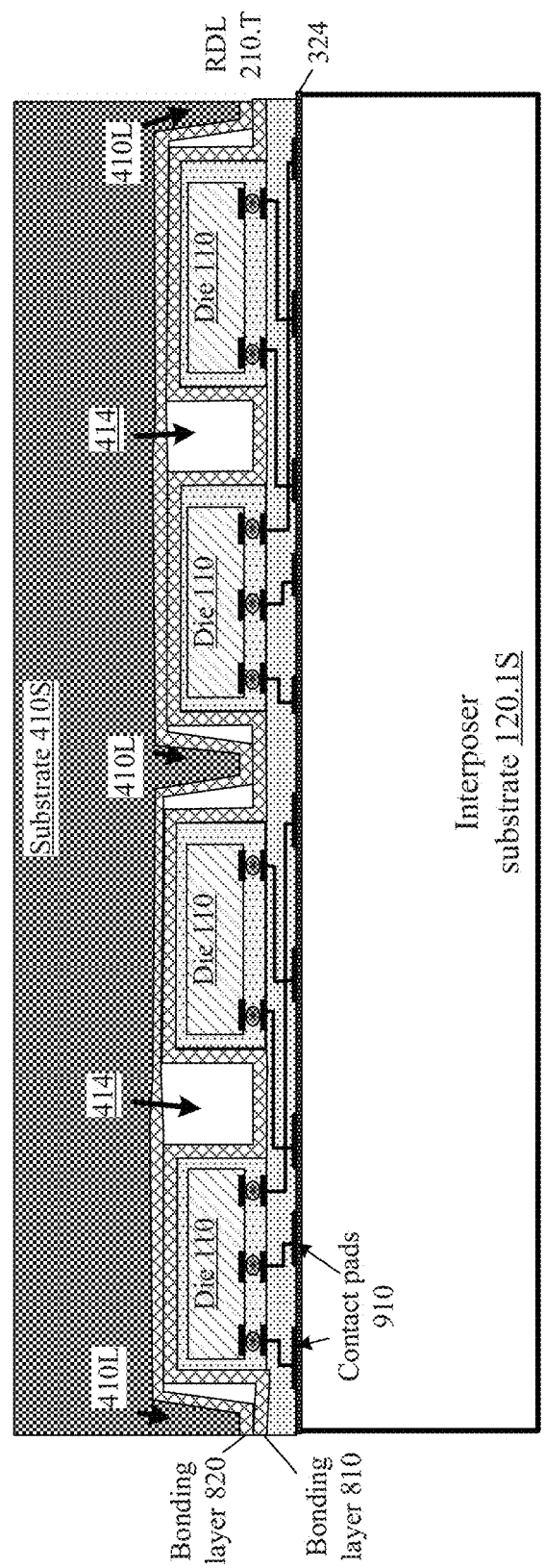
Figure 9C:
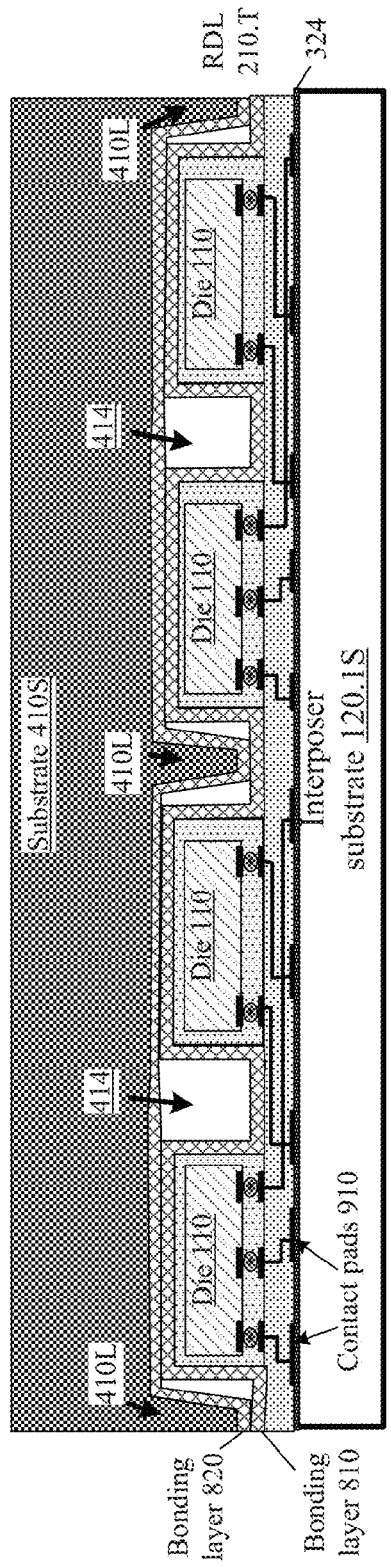
Figure 9D:
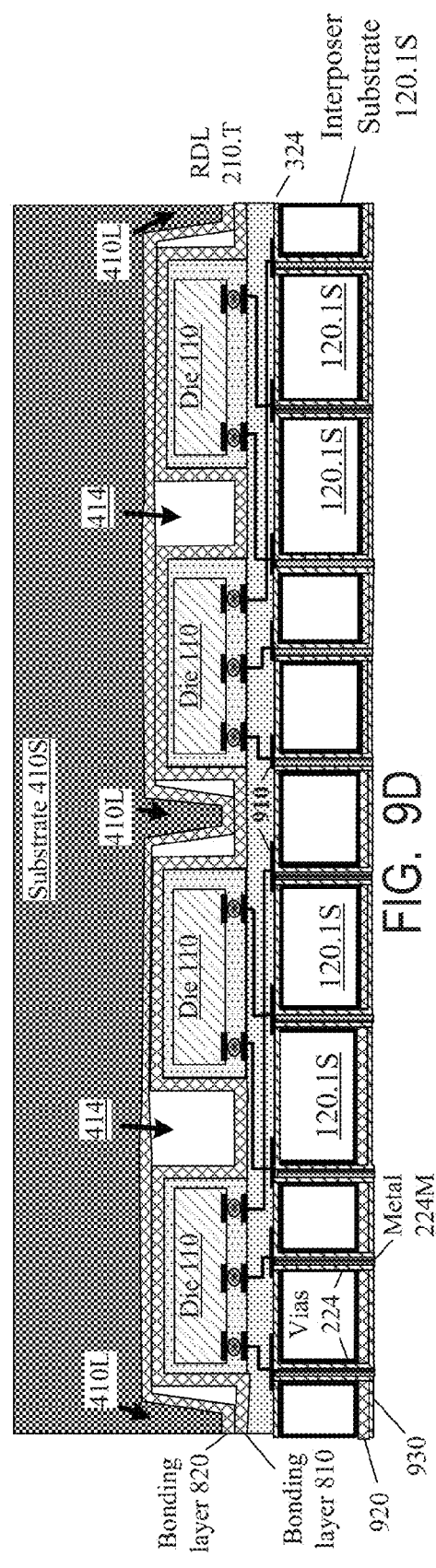

Interposer 120.1 with the dies attached is then bonded to protective substrate 410 (FIG. 9B) as in any embodiment described above. Then the interposer is thinned (FIG. 9C). The dies will be protected by substrate 410 during subsequent steps. Substrate 410 can be thinned at any desired stage.

Then metallized vias 224 are formed from the interposer bottom. An exemplary process is as follows:

1. Dielectric 920 (e.g. silicon dioxide or silicon nitride) is deposited (e.g. by sputtering or CVD) to cover the bottom surface of interposer substrate 120.1S.

2. Vias (through-holes) are formed (by a masked etching or laser drilling or some other process) from the bottom through dielectric 920 and substrate 120.1S. The vias terminate at contact pads 910.

3. Dielectric 930 (e.g. silicon dioxide or silicon nitride) is deposited (e.g. by sputtering or CVD) to cover the bottom surface of interposer substrate 120.1S and to line the vias. Dielectric 930 covers the contact pads 910 from the bottom.

4. Dielectric 930 is etched to expose the contact pads 910. This can be a masked etch. Alternatively, a blanket anisotropic (vertical) etch can be used to remove the dielectric 930 from over at least a portion of each contact pad 910 while leaving the dielectric on the via sidewalls. The vertical etch may or may not remove dielectric 930 outside the vias.

5. A conductive material 224M (e.g. metal) is formed in the vias, possibly by the same techniques as described above (e.g. copper electroplating). The conductive material is not present outside the vias (e.g. it can be polished away by CMP). The conductive material may fill the vias or just line the via surfaces. The conductive material in each via physically contacts the corresponding pad 910.

Subsequent processing steps can be as described above in connection with FIGS. 5C-5E.3. In particular, the bottom RDL 210.B (FIG. 5C) and connections 140.2 can be formed as described above. The structure can be diced if desired (FIG. 5D), and attached to another structure (e.g. PWS 120.2 in FIG. 5E.1).

Figure 10:
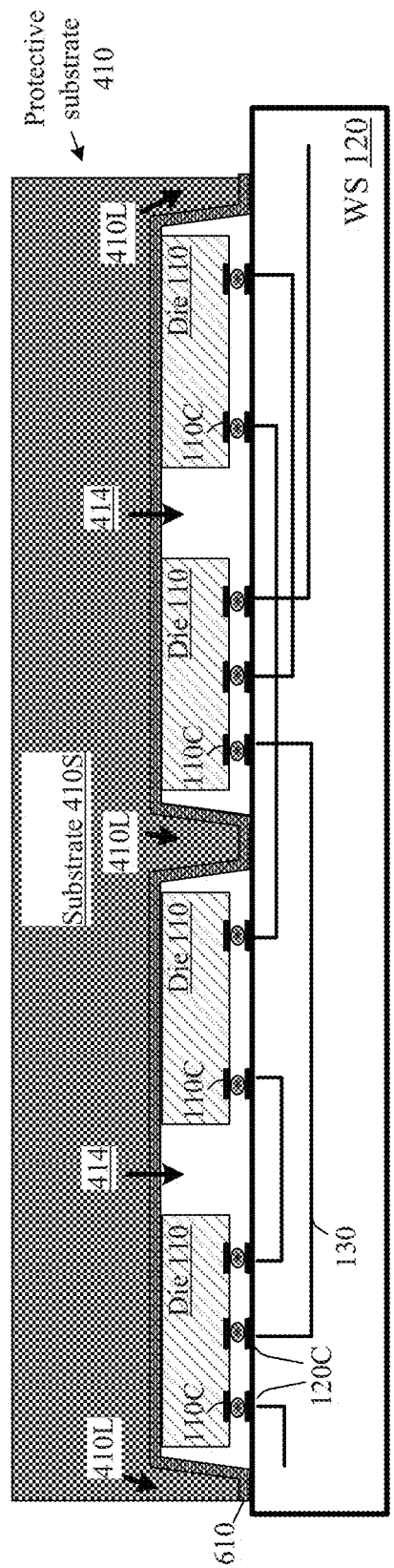

Vias 224 are optional, and further the substrate 120.1 can be any wiring substrate, such as shown at 120 in FIG. 10. This figure illustrates an embodiment using an adhesive 610 to bond the protective substrate 410 to WS 120 at legs 410L and at the cavity top surfaces, but any other bonding method described above can be used. No underfill or other encapsulant is shown, but underfill with or without encapsulation of the entire die can be present.

In some embodiments, vias 224 are formed partly before and partly after the interposer thinning. For example, in some embodiments, the interposer is processed to the stage of FIG. 3C (dielectric 324 is formed, possibly by a high temperature process such as thermal oxidation of silicon), but instead of metal the vias are filled with a temporary filling, e.g. polyimide. Then other processing steps are performed as described above in relation to FIGS. 3E-5B, and in particular the temporary filling is exposed at the interposer bottom when the interposer is thinned. The temporary filling is removed, and metal or other conductive material 224M is placed in the vias as described above in relation to FIG. 9D. This may be advantageous if there is a need to avoid early deposition of metal into the vias (at the stage of FIG. 3D) due to incompatibility with subsequent processing steps, and at the same time it is undesirable to delay deposition of dielectric 324 to the stage of FIG. 9D (if dielectric 324 is formed by a high temperature process for example). Other variations are possible.

The techniques described above in connection with FIGS. 5A-10 can be used to attach any number of separate protective substrates 410 to the same interposer 120.1 or WS 120; different protective substrates 410 can be attached to the same side of a substrate 120.1 or 120, with different dies in different cavities of the same or different protective substrates 410; see FIG. 16 described in more detail below. Other protective substrates 410 can be attached to the opposite side of substrate 120.1 or 120. Some of the dies may have no protective substrate 410 to protect them. Each substrate 120.1S or 410S can be a wafer, and the two substrates can be of the same size in a given assembly 504; but different sizes are also possible in the same assembly.

Figure 11:
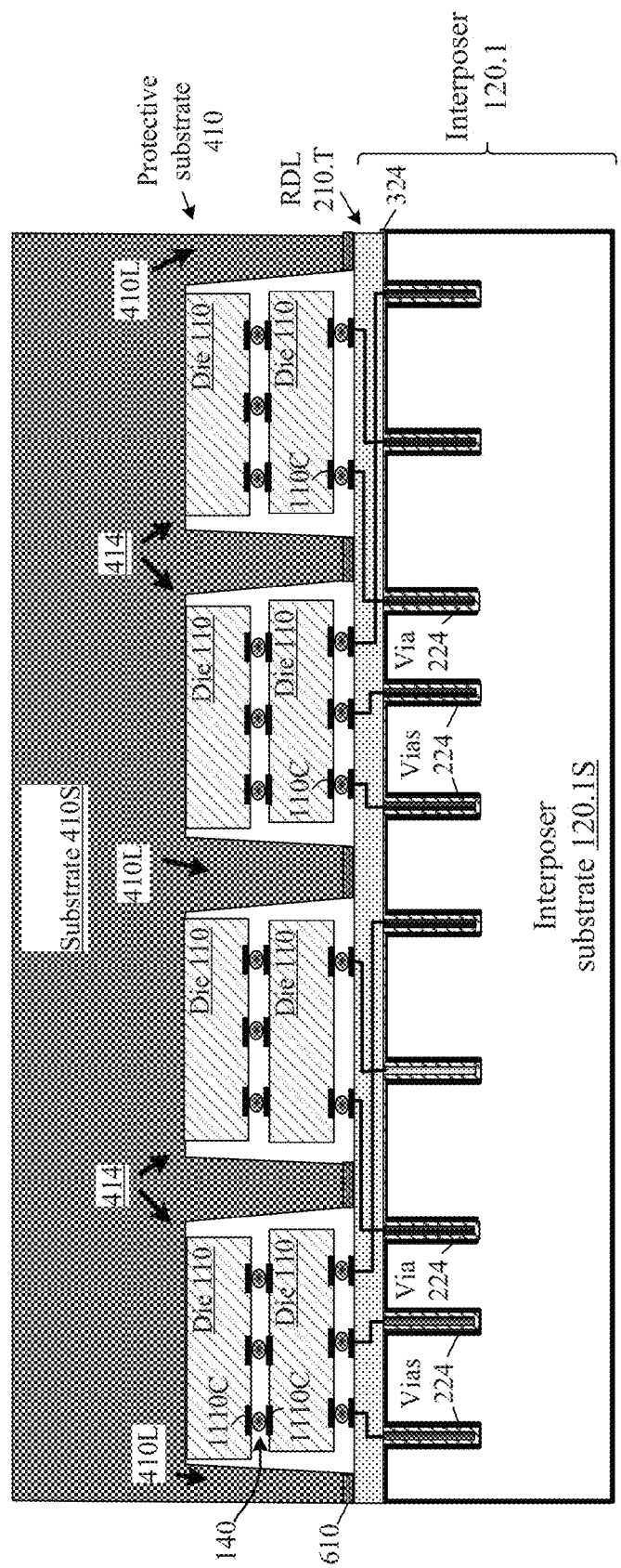

The dies can be stacked one above another in the same cavity (see FIG. 11 showing the structure at the same fabrication stage as FIG. 6.1), with only the top die of each stack physically contacting the corresponding cavity's top surface (a stack may have multiple dies attached to the top surface of a lower die; one or more of the multiple dies may have their top surfaces contacting the cavity's top surface). The dies in each stack may have their respective circuits interconnected through their contact pads 110C and respective connections 140 (which can be of any type described above). In FIG. 11, substrates 120.1S, 410S are bonded together by adhesive 610 on legs 410L as in FIG. 6.1, but the other bonding methods described above can also be used. Stacked dies can also be used with other variations described above, e.g. when the protective substrate is bonded directly to the PWS. A die stack can be replaced by any integrated-circuit package.

Figure 12:
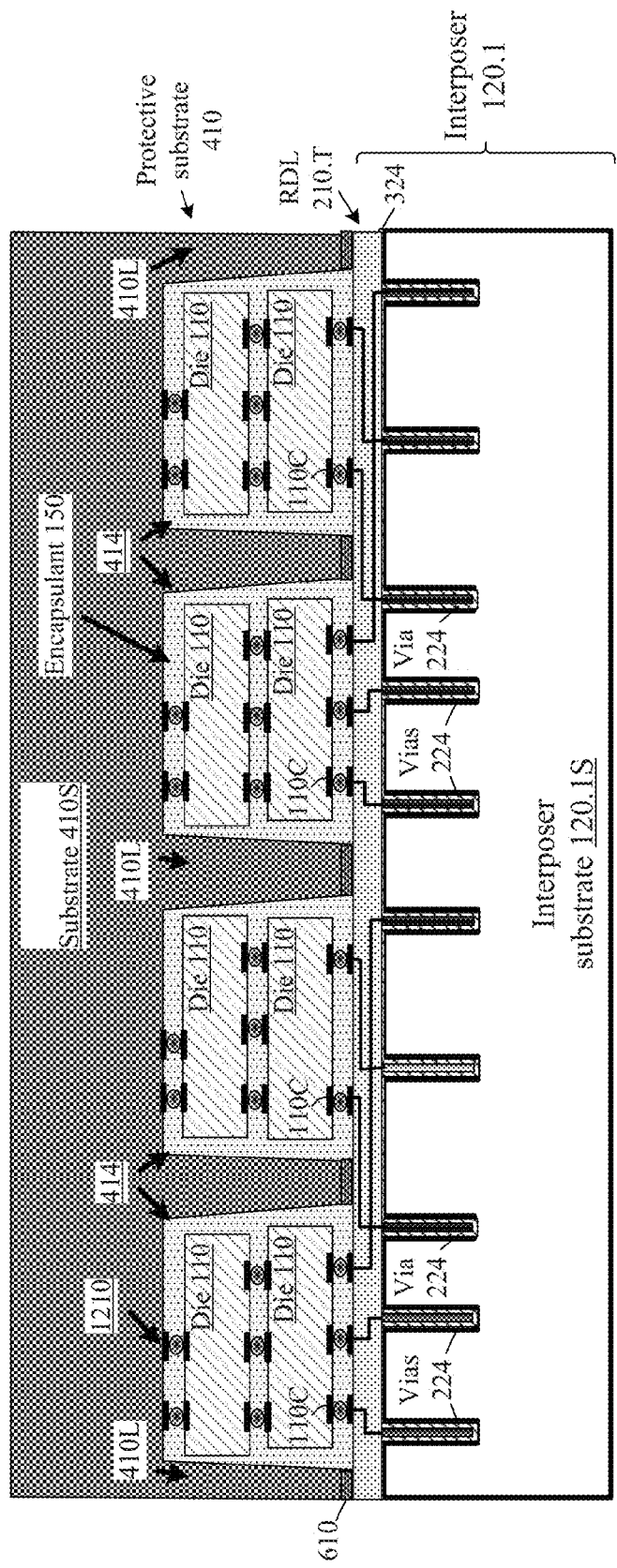

In some embodiments, substrate 410S has circuitry, possibly connected to the circuitry in the dies and/or the interposer 120.1S or the PWS. See FIG. 12, showing the top dies connected to substrate 410S by structures 1210; each structure 1210 includes a contact pad in substrate 410S, a corresponding contact pad on a top die 110, and a connection (e.g. solder or any other type described above) bonding the two contact pads to each other. In the example of FIG. 12, encapsulant 150 underfills and completely surrounds each die, contacting the cavities' top surfaces. As noted above, encapsulation and/or underfilling are optional.

The invention is not limited to the embodiments described above or below. For example, the vias 224 can be formed after the RDLs, and can be etched through one or both of the RDLs. Different features described above or below can be combined. For example, in FIGS. 13A and 13B described below, the substrate 410 is bonded to interposer 120.1 by adhesive 610, but other bonding methods described above can be used. Also, in FIGS. 13A and 13B, the vias 224 are formed before the interposer thinning, but they can be made after the interposer thinning as in FIGS. 9C-9D. The particulars displayed are for illustration purposes only and not to limit the invention.

Figure 13A:
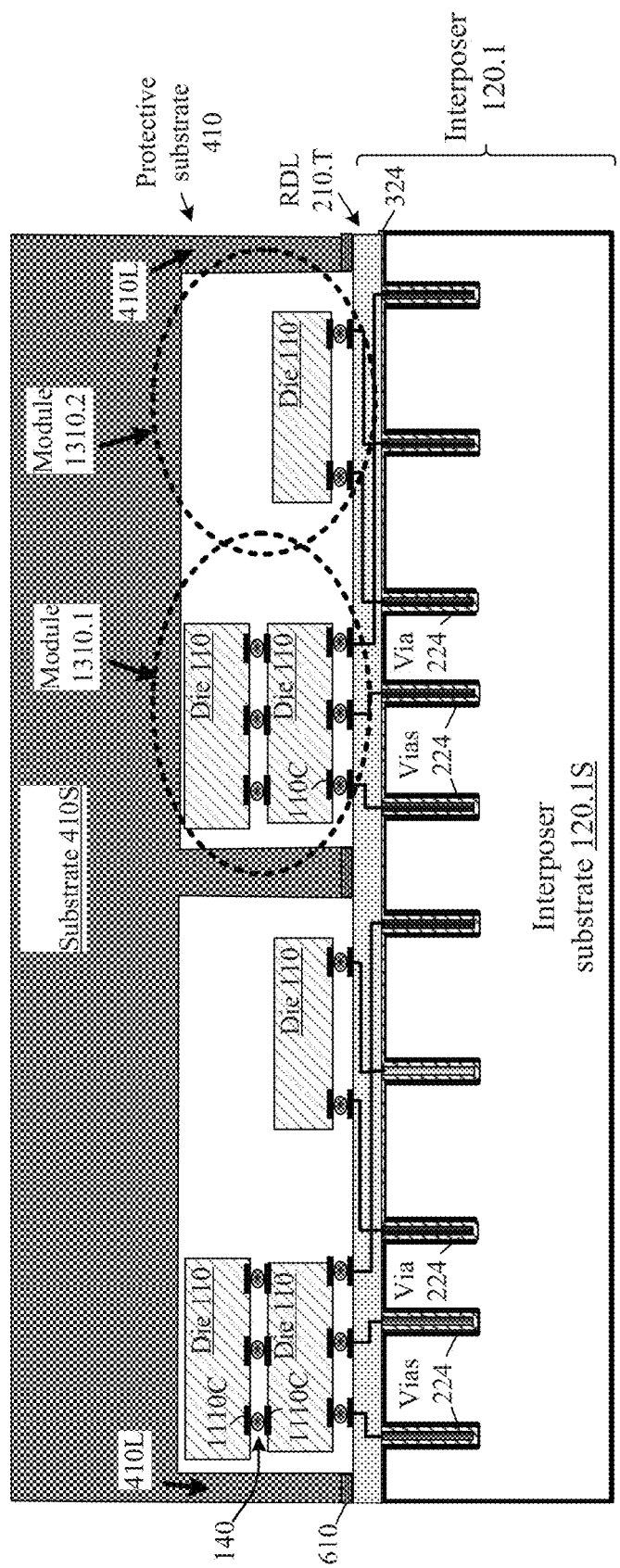
Figure 13B:
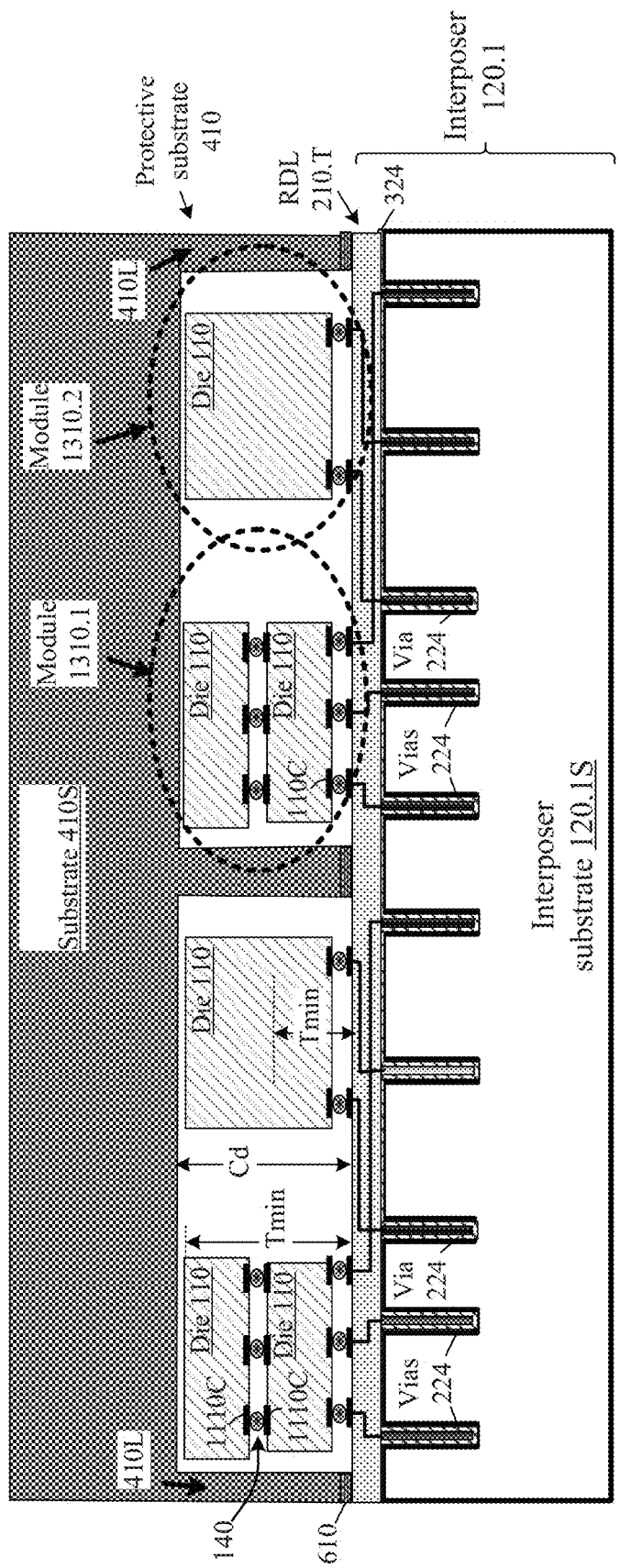

A cavity 414 may include dies, stacks, or other packages of different heights (e.g. as in FIG. 13A), and the heights of the shorter modules may be increased to improve the mechanical strength and/or thermal dissipation—see FIG. 13B. FIGS. 13A and 13B shown assemblies at the stage of FIG. 11 (before interposer thinning). Each cavity 414 includes two modules 1310.1, 1310.2; module 1310.1 contains a stack of two dies, and module 1310.2 includes a single die (a module may be any die or assembly including a stack or other package). The die 110 of module 1310.2 could be made thinner (FIG. 13A), but the cavity depth Cd has to accommodate the module 1310.1, so the thickness of die 110 of module 1310.2 is increased (FIG. 13B) to take advantage of the high Cd value.

FIG. 14 is a flowchart of a process that can be used to determine each die's thickness at the design stage. At step 1410, the minimal thickness of each module 1310 is determined (Tmin may include the height of connections 140 which interconnect different dies in the same module and/or connections 140 which connect the module to the interposer; further, if the top of any module are to be connected to protective substrate 410 (as in FIG. 12), then in some embodiments Tmin includes the height of the corresponding connections.) In the example of FIG. 13B, Tmin is larger for module 1310.1 than for module 1310.2.

At step 1420, the maximum Tmin value is determined (this value is denoted by M in FIG. 14). In the example of FIG. 13B, M is the Tmin value for module 1310.1.

At step 1430, the M value is used to determine the cavity depth Cd. For example, Cd may be set to the M value plus a value determined based on the available manufacturing tolerances (i.e. possible manufacturing errors) and/or desired heat dissipation capabilities and/or the bonding technology (e.g. the thickness of layer 610 or 810 or 820), and/or possibly other parameters.

At step 1440, for each module whose Tmin is less than the maximum value (M), the module's thickness is increased as desired. In the example of FIG. 13B, for module 1310.2, the Tmin value is less than M, so the thickness of the die of module 1310.2 is increased if this would facilitate the die fabrication or improve the die's heat dissipation or if other benefits would exist in increasing the die thickness. At step 1450, the dies are manufactured to using the thickness parameters obtained in steps 1410-1440, the cavities are made to the thickness obtained at step 1430, the protective substrate 410 and the dies are attached to the interposer using any method described above.

Steps 1420, 1430, 1440 are performed automatically in some embodiments, for example by a computer comprising computer processor(s) executing software instructions stored in a computer storage (e.g. memory) or by some other circuitry.

Further, as shown in FIG. 15A, a cavity 414 may have a varying depth: the cavity can be less deep over shorter modules (like 1310.2) than taller modules (like 1310.1). Advantageously, in some embodiments, the thermal resistance is reduced between the shorter modules and the top cavity surface. For example, in some embodiments, the modules have different heights, but the gap between each module's top surface and the overlying cavity surface is the same, and/or has the same thermal resistance. Apart from the thermal resistance considerations, if the top surface of any module is connected to wafer 410 as in FIG. 12, the gap between the top surface of the module's top die and the overlying cavity surface is made equal to the desired height of the connections.

In some embodiments, a cavity with varying depths is provided even for modules of the same height.

Also (FIG. 15B), different cavities may have different depths in the same reinforcement frame. The different depths may be chosen to accommodate different module heights, and/or for other reasons. For example, a module generating more heat may be placed into a shallow cavity to reduce the thermal resistance between the module and the reinforcement frame, but another module generating less heat may be placed into a deeper cavity to increase the tolerance to the module's height variations.

As noted above, multiple protective substrates 410 can be attached to the same interposer. An example is shown in FIG. 16: each reinforcement frame 410 has one or more cavities and covers one or more dies 110 (throughout the examples above and below, a die 110 can be replaced by any type of module 1310 as described above in connection with FIG. 13B). In all the other respects, the structure of FIG. 16 can be as in any embodiment described above. In particular, the dies could be encapsulated and/or underfilled, and could be separated from the top cavity surface by air or other gas or TIM grease or other material, or the dies could physically contact the cavity top surface or could contact a solid material (e.g. TIM) which may contact the cavity top surface. Other variations described above can also be present in the structure of the type of FIG. 16 (for example, the reinforcement frames can be bonded to the interposer by adhesive such as 610 (e.g. punched adhesive tape or other types) that may or may not be present between the frames; other bonding techniques can also be used).

This type of structure can provide multiple advantages. In particular, the interposer areas between the frames 410 are accessible and can be used for test pads 1610: the test pads can be connected to other contact pads in RDL 210.T and/or to metallized vias 224M. The test pads facilitate testing of the assembly before and/or after dicing (dicing is omitted in some embodiments). In some embodiments, test pads are located on dicing lines, i.e. a test pad can be cut through during dicing, and can thus be destroyed or can merely be divided into multiple test pads which can be used for testing each die after dicing.

Also, thermal stresses that may be present before dicing are lower than for a wafer-size (continuous) reinforcement frame.

Further, since each frame 410 covers less than all the dies 110, each frame 410 is easier to align when it is placed on the interposer (because each frame has to be aligned with just the modules covered by the frame). Also, the interposer may have alignment marks (not shown) in the top surface between the positions of frames 410, to facilitate the alignment of each frame.

Figure 16:
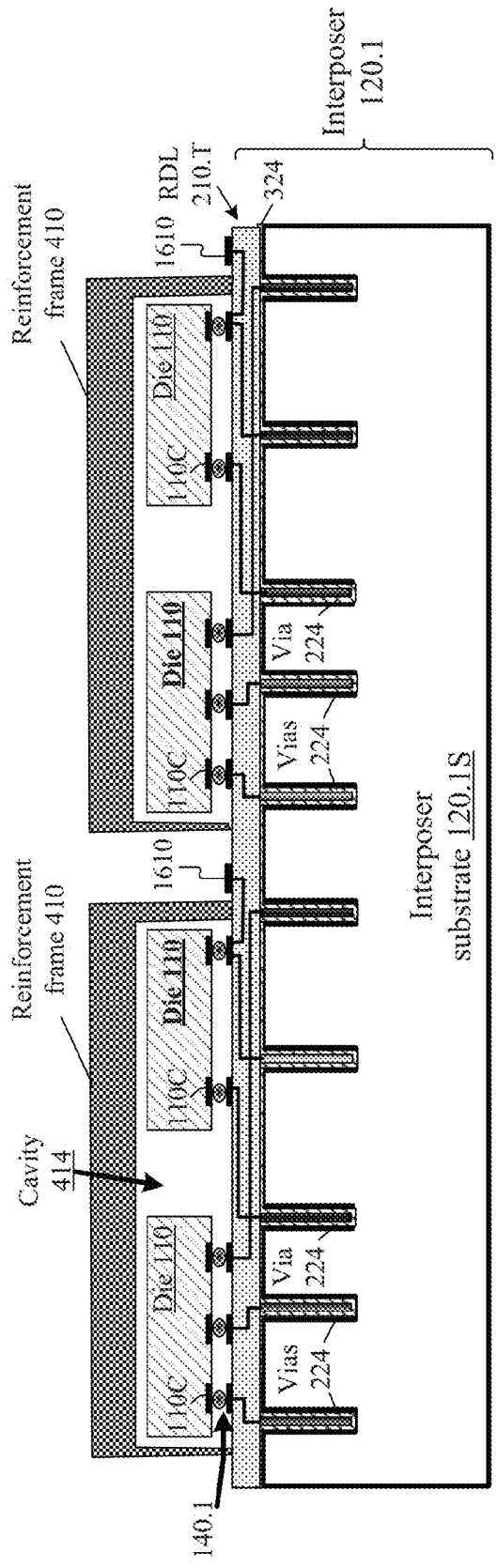
Figure 17:
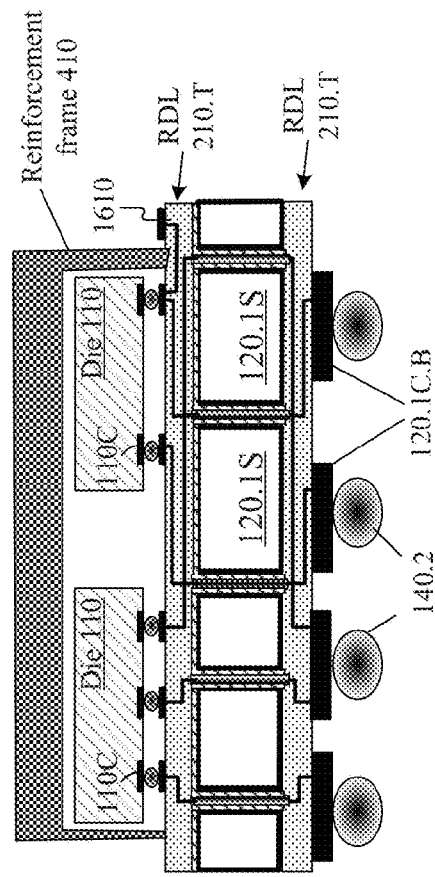

FIG. 17 illustrates an exemplary die that obtained from the structure of FIG. 16 after the interposer thinning and formation of bottom RDL 210.B and connections 140.2 as in FIG. 5D. (As noted above, different features can be combined in any suitable manner, and in particular the connections 140.2 and/or RDL 210.B can be omitted.) In FIG. 17, the dicing lines are placed between the frames 410 so the frames 410 are not diced. Dicing is therefore simplified.

For alignment purposes, a reinforcement frame 410 may have protrusions or slots that mate with the slots or protrusions on the interposer. See FIGS. 18 and 19 showing the structure at the stage of FIG. 17. In FIG. 18, reinforcement frame 410 has protrusions 1810 that mate with slots on the interposer (protrusions 1810 may extend into the interposer substrate 120.1 or just into the RDL 210.T). In FIG. 19, frame 410 has slots that mate with interposer protrusions 1910 (the interposer protrusions can be extensions of the interposer substrate or can be part of RDL 210.T). Such alignment features can be combined (the protrusions can be present on both the interposer and frame 410, with mating slots on frame 410 and the interposer). Such alignment features can be present in any embodiment described above, including the embodiments with a single frame 410 (see FIG. 5C).

As noted above, openings 410 can be cavities as shown above, or can be through-holes, or can be cavities with through-holes. FIGS. 20.1, 20.2 show respectively a vertical cross section and a top view of a through-hole embodiment; the vertical cross section of FIG. 20.1 is marked as "20.1" in FIG. 20.2. This embodiment is similar to FIG. 17, but opening 414 is a through-hole in frame 410; frame 410 laterally surrounds the dies. The through-hole facilitates frame alignment and attachment to the interposer (since the die area is visible and accessible during frame placement and attachment). Also, test pads 1610 can be placed inside through-hole 414 (at the top of RDL 210.T or dies 110 for example); the test pads can be connected to each other and/or other circuitry in the dies and the interposer, and are accessible via through-hole 414.

Figure 21:
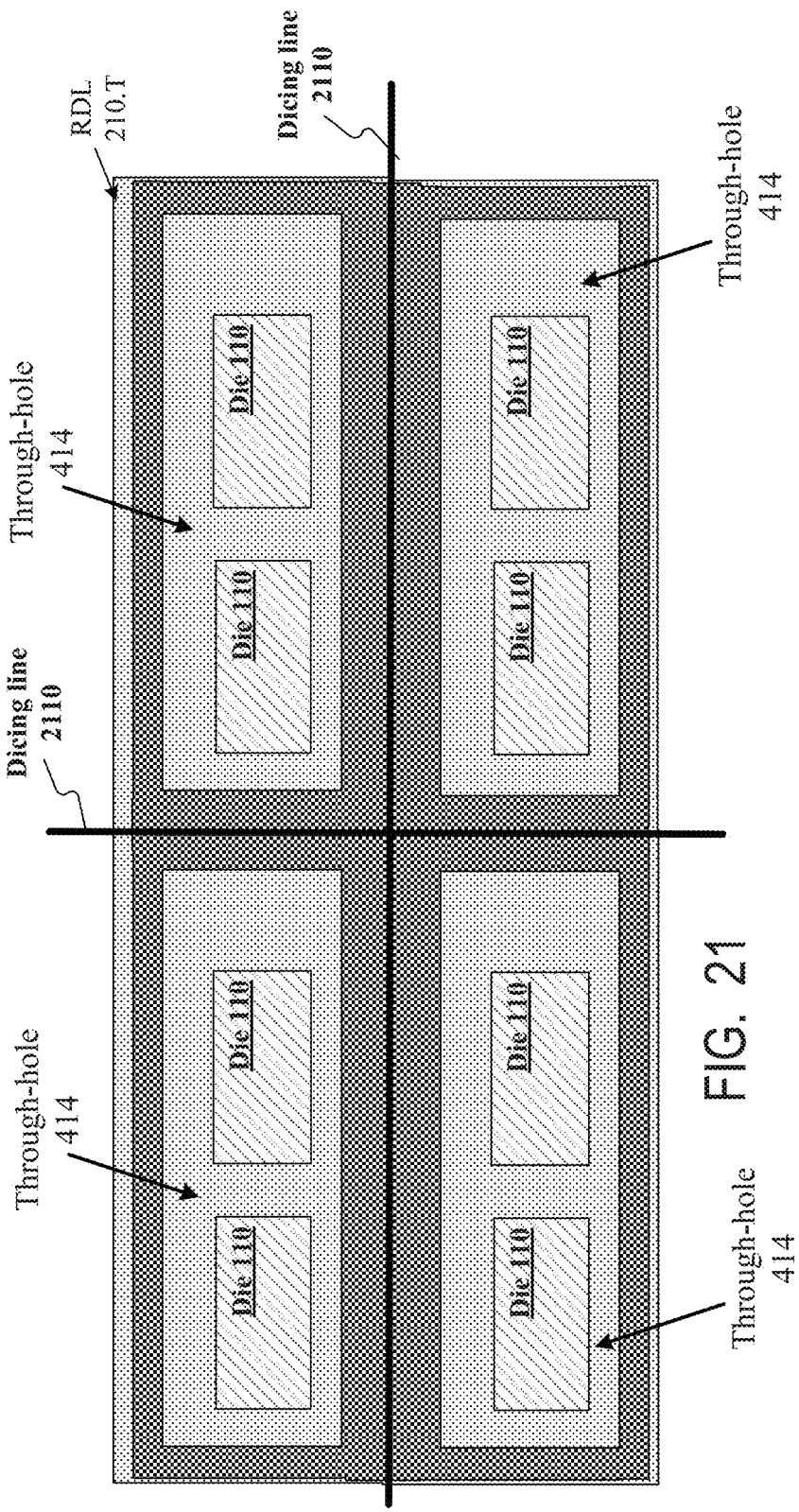

Similar to FIG. 16, in embodiments in which an opening 414 is a through-hole, each frame 410 can be provided as a separate structure before attachment to the interposer as in. The advantages include those described above in relation to FIG. 16. Alternatively, the frames 410 can be part of a single wafer as in FIG. 5A; see FIG. 21 showing an exemplary top view of a portion of a wafer-size frame 410 with four holes 414; the frame and the interposer will be diced along dicing lines 2110. As in other schemes above, dicing is omitted in some embodiments.

While a through-hole-type frame 410 (such as in FIGS. 20.1, 20.2) is not as strong as a cavity-type frame (such as in FIG. 5D), through-hole-type frames can have advantages. In particular, as noted above, they allow for more locations of test pads 1610, and they can be easier to align and bond to the interposer. Also, they may have less mechanical stress. Further, they can support heat sinks bonded directly to the dies: see e.g. heat sink (heat spreader) 160 in FIGS. 22.1 (vertical cross section) and 22.2 (top view): these figures show the same structure and the same views as FIGS. 20.1, 20.2 but with heat sink 160 supported on two opposite sides of frame 410. The heat sink can be supported by all the sides of frame 410, or by three sides, or in some other way (of note, through hole 414 may have more than four sides and does not have to be rectangular in top view, e.g. the through-hole can be circular or any other shape). In FIGS. 22.1 and 22.2, the heat sink is bonded to dies 110 by a bonding layer 2230. Layer 2230 can be adhesive and/or TIM and/or metal and/or other type of layer suitable for bonding. The heat sink can be bonded to less than all dies 110. Layer 2230 can be omitted if direct bonding is used. This bonding is optional: instead or in addition, the heat sink can be bonded to frame 410 by a bonding layer or by direct bonding. A heat sink may overlie, and be supported by, multiple through-holes in the same or multiple reinforcement frames; such a heat sink may be bonded to multiple reinforcement frames and/or multiple dies in the same or different through-holes.

Figure 23:
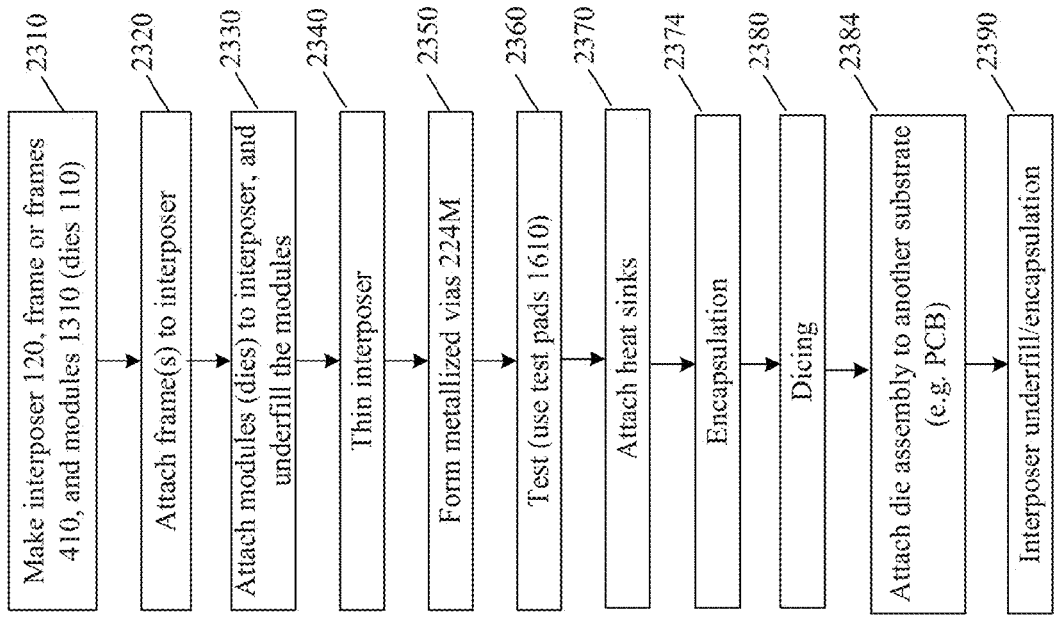
FIG. 23 is a flowchart of a manufacturing method for manufacturing of assemblies according to some embodiments as set forth in detail below.

The through-hole scheme increases manufacturing flexibility in that the dies 110 and frames 410 can be attached to interposer 120.1 in any order. An exemplary manufacturing sequence is illustrated in the flowchart of FIG. 23. In this embodiment, step 2310 illustrates manufacturing of the interposer 120 (i.e. 120.1), the frame or frames 410, and the modules 1310 (e.g. dies 110). The interposer may or may not include metallized vias 224M (the vias can be formed later as described above in relation to FIG. 9D). At step 2320, the frame or frames 410 are attached to the interposer. At step 2330, the dies 110 (or the modules) are attached to the interposer and underfilled and/or encapsulated on all sides (laterally, above and below), as in FIG. 1 for example. (The dies can be manufactured after step 2320, or can be manufactured and attached before step 2320.) At step 2340, the interposer is thinned. At step 2350, metallized vias 224M are formed in the interposer (as noted above, some or all of these vias could be formed at step 2310 and revealed on the interposer backside at step 2340). At step 2360, the assembly is tested (using test pads 1610). At step 2370, one or more heat sinks 160 are attached over holes 414. At step 1374, encapsulant (such as 150 in FIG. 1) can be dispensed to encapsulate the dies above the interposer. The encapsulant is optional, and encapsulation can precede heat sink attachment or can be performed after heat sink attachment if the heat sinks do not completely cover the holes 414. Alternatively, some encapsulation (or at least underfilling of dies 110) can be performed before heat sink attachment (instead of or in addition to step 2330 underfilling), and additional encapsulation can be performed after heat sink attachment. Of note, the amount of encapsulant can be controlled based on the interposer warpage. The type of encapsulant can also be controlled based on the warpage. For example, if the interposer bows upward, i.e. the middle portion is higher than the edges, and the encapsulant induces compressive stress, then more encapsulant can be dispensed to counteract the warpage, and/or the encapsulant material can be chosen to provide more compressive stress to counteract the warpage. Encapsulation at these late stages, including possibly after heat sink attachment, allows the encapsulant material and amount to be chosen based on the warpage measurements performed on the assembly immediately before encapsulation.

Figure 24:
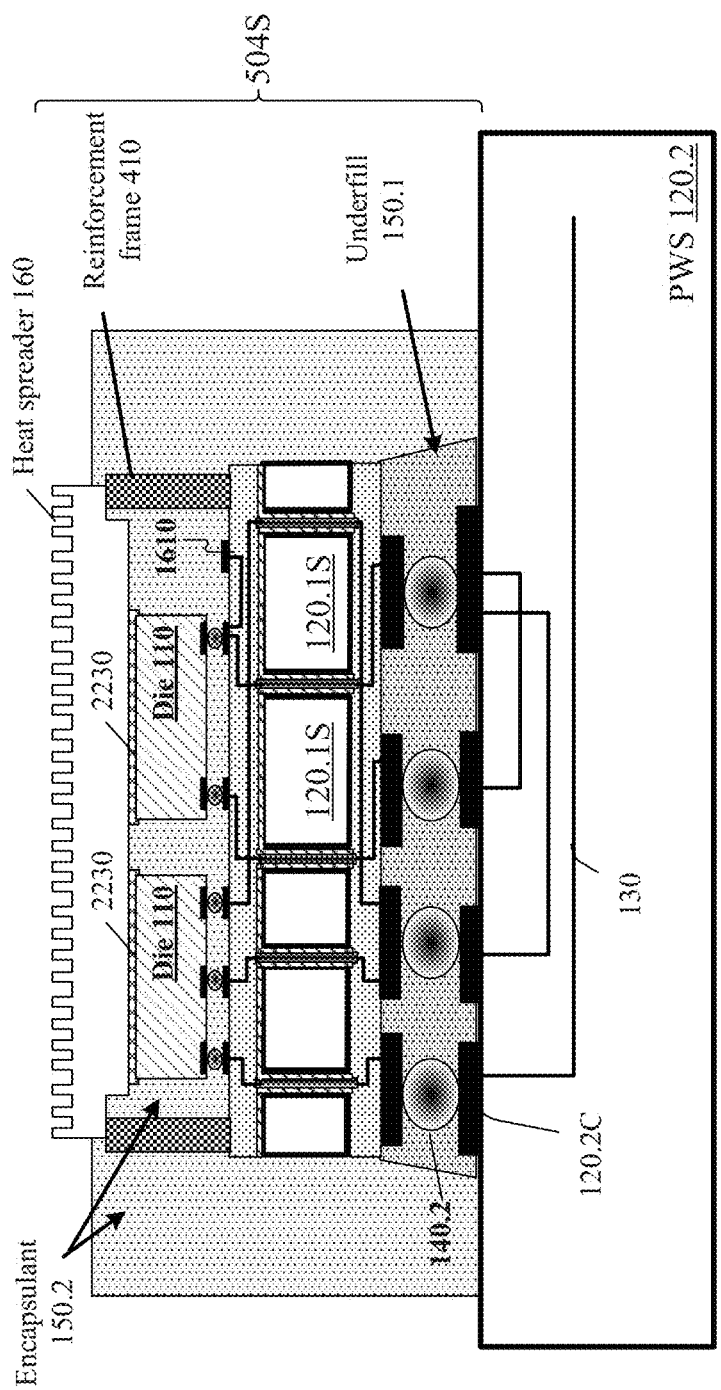
FIGS. 24, 25, 26 illustrate vertical cross-sections of assemblies according to some embodiments as set forth in detail below.

Dicing is performed at step 2380. If needed (step 2384), each die (i.e. each stack) 504S obtained at step 2380 is attached to another substrate, e.g. PWS 120.2 (this is shown in FIG. 24 for the assembly of FIG. 22.1; the process of FIG. 23 can also be performed with other types of assemblies discussed above). Then, as indicated by step 2390, the entire die 504S, including the interposer, can be encapsulated. For example, in FIG. 24, encapsulant layers 150.1 (underfill) and 150.2 (e.g. epoxy) have been dispensed and cured to encapsulate (cover) the die 504S from below and on the sides to protect the die or simply to reduce warpage: the stresses induced by the encapsulant may counteract other warping stresses in the assembly and/or in the PWS. In some embodiments, the warpage is reduced to below 100 microns. In the example of FIG. 24, the encapsulant does not reach the top of die 504S but only covers the die from below and on the sides part way to heat sink 160. Encapsulant 150.2 also fills the cavity containing the dies 110. Part of encapsulant 150.2 may have been formed at step 2330 and/or 2374 as described above. In other embodiments, the encapsulant may rise to any level above or below the level shown in FIG. 24; for example, the encapsulant may completely cover the heat sink on the sides and the top, as shown for example in FIGS. 25-26.

Figure 25:
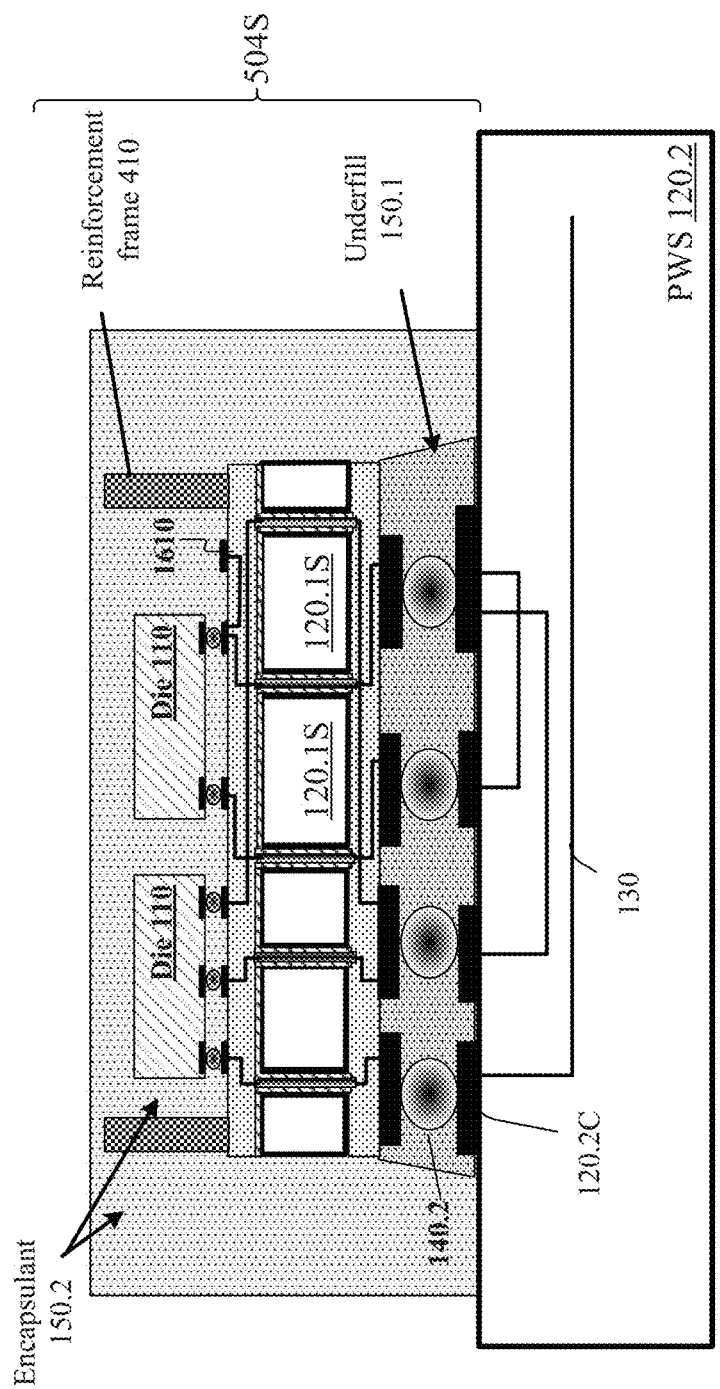

Many variations are possible. FIG. 25 illustrates the same assembly as in FIG. 24 but the die 504S is as in FIG. 20.1 (no heat sink 160). Also, in this example, encapsulant layer 150.2 completely covers the die 504S, but the encapsulant can be formed to a lower level (e.g. as in FIG. 24), if appropriate for warpage compensation or for any other purpose. The encapsulant can be formed as described above for FIG. 24.

Figure 26:
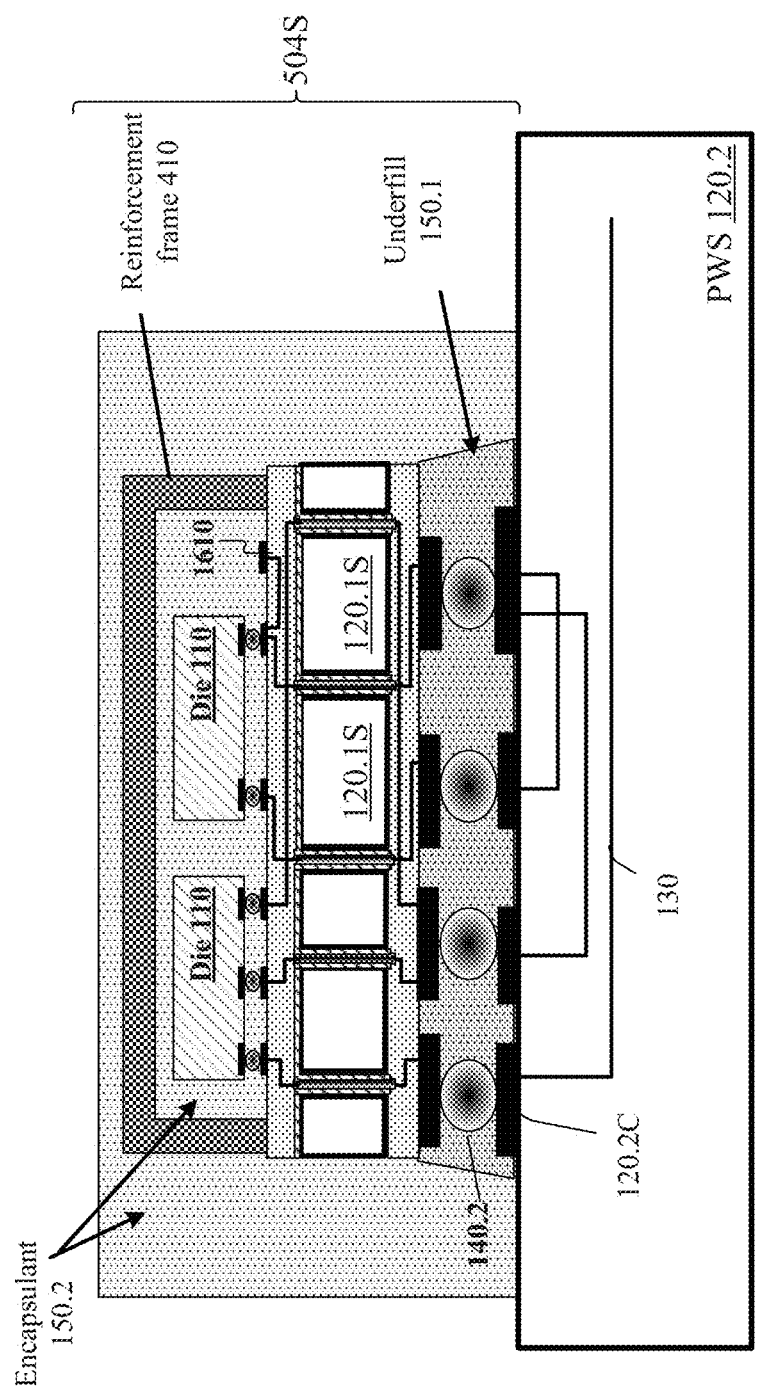

FIG. 26 illustrates the same assembly but the die 504S is as in FIG. 17. Again, encapsulant layer 150.2 completely covers the die 504S, but the encapsulant can be formed to a lower level. Other types of dies 504S can be used.

Some aspects of some embodiments are described by the following clauses:

Clause 1 describes a manufacture comprising:

a first substrate (e.g. interposer 120 or 120.1, or interposer substrate 120.1S) comprising one or more first contact pads (e.g. top contact pads 120.1C.T);

a plurality of modules (e.g. dies 110 or other assemblies/packages, e.g. modules 1310) attached to the first substrate, at least one module comprising a semiconductor integrated circuit, the module comprising one or more contact pads each of which is attached to a respective first contact pad (of note, there could also be dummy modules, e.g. dummy dies, if the assembly was initially designed to accommodate more modules than needed for a particular embodiment);

a reinforcement frame (e.g. 410 or 410S) comprising one or more cavities, the reinforcement frame being attached to the first substrate, wherein at least part of each module is located in a corresponding cavity in the reinforcement frame (see e.g. FIG. 13A), wherein at least two modules have different heights and are at least partially located in the same cavity in the reinforcement frame.

Of note, the term "cavity" as used herein covers a cavity with a through-hole. However, the term "cavity" as used herein has a depth which is a parameter that limits the height of modules that can be placed in the cavity. Thus, if an opening 414 has vertical walls and no "roof" (as in FIG. 20.1 for example), then the opening is not a cavity because the opening does not limit the height of any module that can be placed in the opening.

Clause 2 describes a manufacture comprising:

a first substrate (e.g. interposer 120 or 120.1, or interposer substrate 120.1S) comprising one or more first contact pads;

a plurality of modules attached to the first substrate, each module comprising a semiconductor integrated circuit, each module comprising one or more contact pads each of which is attached to a respective first contact pad;

a reinforcement frame comprising one or more cavities, the reinforcement frame being attached to the first substrate, wherein at least part of each module is located in a corresponding cavity in the reinforcement frame (of note, multiple modules may be located in the same cavity);

wherein the plurality of modules comprises a first module and a second module that are at least partially located in the same cavity which is deeper over the first module than over the second module (as in FIG. 15A for example).

Figure 15B:
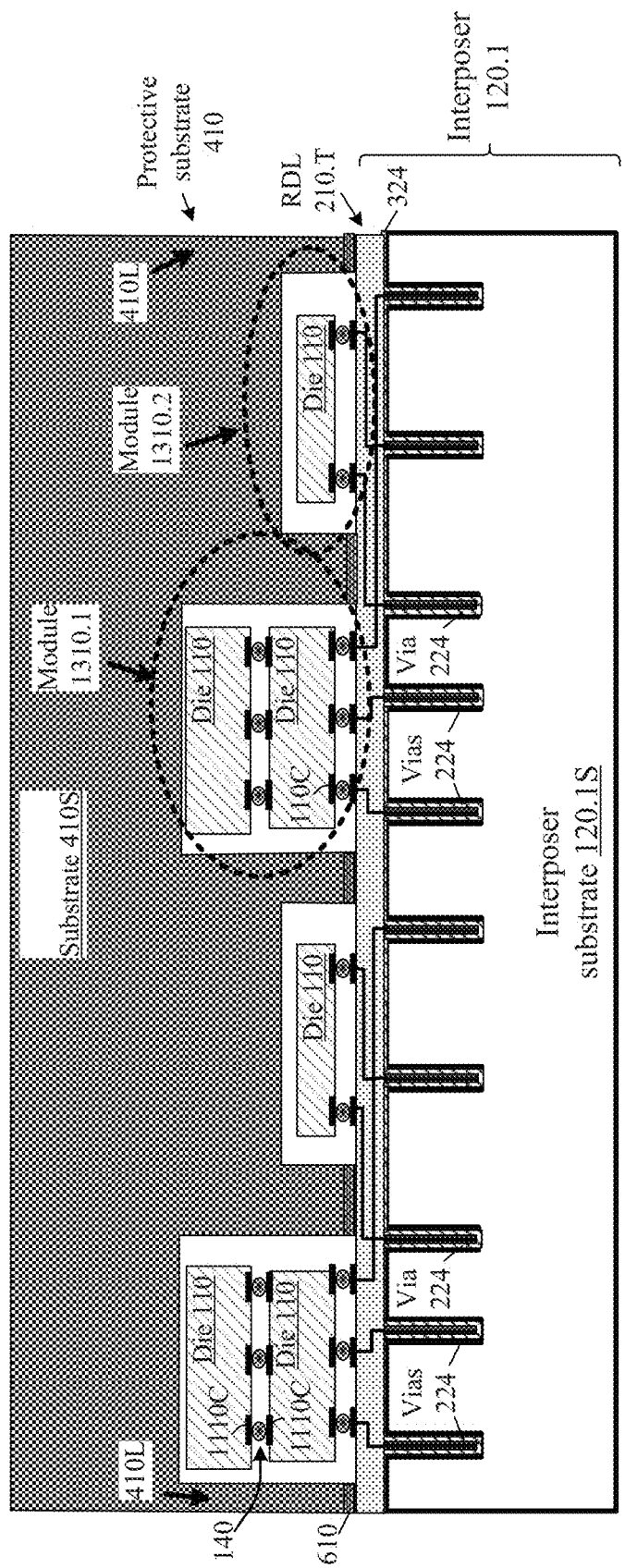

Clause 3 describes a manufacture comprising:

a first substrate comprising one or more first contact pads;

a plurality of modules attached to the first substrate, each module comprising a semiconductor integrated circuit, each module comprising one or more contact pads each of which is attached to a respective first contact pad;

a reinforcement frame comprising a plurality of cavities, the reinforcement frame being attached to the first substrate, wherein at least part of each module is located in a corresponding cavity in the reinforcement frame;

wherein the plurality of modules comprises a first module and a second module taller than the first module, and the cavity corresponding to the second module is deeper than the cavity corresponding to the first module (as in FIG. 15B for example).

Clause 4 describes a method (e.g. as in FIG. 14) for designing a manufacture comprising a plurality of modules attached to a first substrate and covered by a reinforcement frame comprising a first cavity which covers the plurality of modules, each module comprising a semiconductor integrated circuit (as in FIG. 13B for example), the method comprising:

(a) determining a minimum thickness Tmin for each module;

(b) determining a maximum value M of the minimum thicknesses of the modules;

(c) determining a depth of the first cavity by a process using the maximum value M;

(d) if any module's minimum thickness Tmin is less than M, then determining, for at least one module whose minimum thickness Tmin is less than M, if the module's thickness is to be increased, and if the module's thickness is to be increased than increasing the module's thickness.

Clause 5 describes the method of clause 4 further comprising manufacturing the modules based on the modules' thicknesses.

Clause 6 describes the method of clause 4 or 5 wherein at least one module's thickness is increased in operation (d), and increasing the module's thickness comprises increasing a thickness of at least one semiconductor integrated circuit in the module.

Clause 7 describes a manufacture comprising:

a first substrate comprising a first side and one or more first contact pads at the first side;

one or more modules attached to the first substrate, each module comprising a semiconductor integrated circuit, each module comprising one or more contact pads each of which is attached to a respective first contact pad; and a plurality of reinforcement frames attached to the first substrate (as in FIG. 16 for example), each reinforcement frame comprising one or more openings, at least part of each module being located in a corresponding opening in a corresponding reinforcement frame.

In some embodiments, at least one opening is a cylindrical through-hole. "Cylindrical" is not limited to "circular"; for example, in FIG. 22.2, through-hole 414 may be rectangular in top view, or elliptic, or of any other shape. Also, "cylindrical" is not limited to a "right cylinder"; in other words, the walls of through-hole 414 do not have to be vertical, but may be at some other)(non-90° angle to reinforcement frame 410 or interposer 120.1.

Clause 8 describes the manufacture of clause 7 wherein the reinforcement frames are spaced from each other.

Clause 9 describes the manufacture of clause 7 or 8 wherein the first substrate comprises one or more test pads (e.g. 1610) for testing the manufacture which are located outside of the reinforcement frames.

Clause 10 describes the manufacture of clause 9 wherein at least one test pad is located between at least two reinforcement frames.

Clause 11 describes a method for manufacturing a manufacture, the method comprising:

obtaining a first substrate comprising a first side and one or more first contact pads at the first side;

obtaining one or more modules attached to the first substrate, each module comprising a semiconductor integrated circuit, each module comprising one or more contact pads each of which is attached to a respective first contact pad; and attaching a plurality of reinforcement frames to the first substrate, each reinforcement frame comprising one or more openings, at least part of each module being located in a corresponding opening in a corresponding reinforcement frame. See FIG. 16 for example.

Clause 12 describes the method of clause 11 wherein the reinforcement frames are spaced from each other.

Clause 13 describes the method of clause 11 or 12 further comprising dicing the first substrate between at least two reinforcement frames to form a plurality of dies, each reinforcement frame being in one of the dies. FIG. 17 shows one such die in one embodiment.

Clause 14 describes the method of clause 11, 12 or 13 wherein the first substrate comprises one or more test pads for testing the manufacture which are located outside of the reinforcement frames.

Clause 15 describes the method of clause 14 wherein at least one test pad is located between at least two reinforcement frames.

Clause 16 describes a manufacture comprising:

a first substrate comprising a first side and one or more first contact pads at the first side;

one or more modules attached to the first substrate, each module comprising a semiconductor integrated circuit, each module comprising one or more contact pads each of which is attached to a respective first contact pad; and one or more reinforcement frames attached to the first substrate, each reinforcement frame comprising one or more openings, at least part of each module being located in a corresponding opening in a corresponding reinforcement frame;

wherein the first substrate comprises a portion laterally surrounding the one or more reinforcement frames. For example, in FIG. 17, the interposer comprises a portion (including test pad 1610) laterally surrounding the reinforcement frame 410.

Clause 17 describes the manufacture of clause 16 wherein the portion laterally surrounding the one or more reinforcement frames comprises one or more test pads for testing the manufacture.

Clause 18 describes the manufacture of clause 17 wherein at least one test pad is electrically connected to at least one module (e.g. by interconnect lines in RDL 210.T in FIG. 17).

Clause 19 describes a manufacture comprising:
a first substrate comprising a first side and one or more first contact pads at the first side;
one or more modules attached to the first substrate, each module comprising a semiconductor integrated circuit, each module comprising one or more contact pads each of which is attached to a respective first contact pad; and
one or more reinforcement frames attached to the first substrate, each reinforcement frame comprising one or more openings, at least part of each module being located in a corresponding opening in a corresponding reinforcement frame;
wherein in at least one reinforcement frame, at least one opening comprises a through-hole. See FIG. 20.1 for example. Of note, the through-hole sidewalls do not need to be vertical, and the opening may be a cavity with a through-hole (possibly multiple through-holes).

Clause 20 describes the manufacture of clause 19 wherein the manufacture comprises one or more test pads for testing the manufacture which are accessible through the through-hole and are laterally surrounded by the at least one reinforcement frame. See e.g. test pads 1610 in FIG. 20.1.

Clause 21 describes the manufacture of clause 20 wherein at least one test pad is part of the first substrate (e.g. as the test pad 1610 which is part of RDL 210.T in FIG. 20.1).

Clause 22 describes the manufacture of clause 20 or 21 wherein at least one test pad is part of a module at least partially located in the at least one opening (e.g. the test pad on top of die 110 in FIG. 20.1).

Clause 23 describes a method for making a manufacture (e.g. as in FIG. 23), the method comprising:
obtaining a first substrate comprising a first side and one or more first contact pads at the first side;
obtaining one or more modules attached to the first substrate, each module comprising a semiconductor integrated circuit, each module comprising one or more contact pads each of which is attached to a respective first contact pad; and
attaching one or more reinforcement frames to the first substrate, each reinforcement frame comprising one or more openings, at least part of each module being located in a corresponding opening in a corresponding reinforcement frame;
wherein in at least one reinforcement frame, at least one opening comprises a through-hole.

Clause 24 describes the method of clause 23 wherein the at least one reinforcement frame is attached to the first substrate before at least part of at least one module partially located in the through-hole.

Clause 25 describes the manufacture of clause 19 further comprising one or more heat sinks (e.g. 160) each of which overlies one or more through-holes in one or more reinforcement frames, wherein at least one heat sink overlying at least one through-hole in at least one reinforcement frame is attached to the reinforcement frame and/or to at least one module at least partially located in the through-hole, each heat sink having a higher thermal conductivity than each reinforcement frame.

Clause 26 describes the manufacture of claim 25 wherein at least one heat sink overlying at least one through-hole in at least one reinforcement frame is attached to the reinforcement frame.

Clause 27 describes the manufacture of claim 25 wherein at least one heat sink overlying at least one through-hole is attached to at least one module at least partially located in the through-hole.

Clause 28 describes the manufacture of claim 19 wherein the first substrate comprises a first alignment feature, and at least one reinforcement frame comprises a second alignment feature, and one of the first and second alignment features is a recess, and the other one of the first and second alignment features a protrusion having no electrical functionality and at least partially located in the recess.

The invention is not limited to the examples above. Other embodiments and variations are within the scope of the invention, as defined by the appended claims.

The invention claimed is:

1. An assembly comprising:
a first substrate comprising a plurality of first contact pads;
a plurality of modules attached to the first substrate, at least one said module comprising a semiconductor integrated circuit, the module comprising one or more contact pads each of which is attached to a respective first contact pad;
a reinforcement frame comprising one or more cavities, the reinforcement frame being attached to the first substrate, wherein at least part of each said module is located in a corresponding cavity in the reinforcement frame, wherein at least two said modules have different heights and are at least partially located in the same cavity in the reinforcement frame;
wherein the reinforcement frame comprises a through-hole; and
the assembly further comprises one or more heat sinks each of which overlies the through-hole, wherein at least one said heat sink overlying the through-hole is attached to the reinforcement frame and/or to at least one said module at least partially located in the through-hole, each said heat sink having a higher thermal conductivity than the reinforcement frame.

2. An assembly comprising:
a first substrate comprising a first side and one or more first contact pads at the first side;
one or more modules attached to the first substrate, each said module comprising a semiconductor integrated circuit, each said module comprising one or more contact pads each of which is attached to a respective first contact pad; and
one or more reinforcement frames attached to the first substrate, each said reinforcement frame comprising one or more openings, at least part of each said module being located in a corresponding opening in a corresponding reinforcement frame;
wherein in at least one said reinforcement frame, at least one said opening comprises a through-hole; and
the assembly further comprises one or more heat sinks each of which overlies one or more of said through-holes in one or more of said reinforcement frames, wherein at least one said heat sink overlying at least one said through-hole in at least one said reinforcement frame is attached to the reinforcement frame and/or to at least one said module at least partially located in the through-hole, each said heat sink having a higher thermal conductivity than each said reinforcement frame.

3. The assembly of claim 2 wherein the assembly comprises one or more test pads for testing the assembly which are accessible through at least one said through-hole and are laterally surrounded by the corresponding reinforcement frame.

4. The assembly of claim 3 wherein at least one said test pad is part of the first substrate.

5. The assembly of claim 3 wherein at least one said test pad is part of a module at least partially located in the at least one opening.

6. The assembly of claim 2 wherein at least one said heat sink overlying at least one said through-hole in at least one said reinforcement frame is attached to the reinforcement frame.

7. The assembly of claim 2 wherein at least one said heat sink overlying at least one said through-hole is attached to at least one said module at least partially located in the through-hole.

8. The assembly of claim 2 wherein the first substrate comprises a first alignment feature, and at least one said reinforcement frame comprises a second alignment feature, and one of the first and second alignment features is a recess, and the other one of the first and second alignment features is a protrusion having no electrical functionality and at least partially located in the recess.

9. The assembly of claim 2 wherein the one or more reinforcement frames are directly bonded to the first substrate.

10. The assembly of claim 2 wherein the one or more reinforcement frames are a plurality of reinforcement frames.

11. The assembly of claim 2 wherein at least one said through-hole is cylindrical.

12. The assembly of claim 10 wherein the reinforcement frames are spaced from each other.

13. The assembly of claim 10 wherein the first substrate comprises one or more test pads for testing the assembly which are located outside of the reinforcement frames.

14. The assembly of claim 13 wherein at least one said test pad is located between at least two said reinforcement frames.

15. A method for manufacturing an assembly, the method comprising:
   obtaining a first substrate comprising a first side and one or more first contact pads at the first side;
   obtaining one or more modules attached to the first substrate, each said module comprising a semiconductor integrated circuit, each said module comprising one or more contact pads each of which is attached to a respective first contact pad; and
   attaching one or more reinforcement frames to the first substrate, each said reinforcement frame comprising one or more openings, at least part of each said module being located in a corresponding opening in a corresponding reinforcement;
   wherein in at least one said reinforcement frame, at least one said opening comprises a through-hole; and
   the method further comprises attaching one or more heat sinks over one or more of said through-holes in one or more of said reinforcement frames, wherein at least one said heat sink overlying at least one said through-hole in at least one said reinforcement frame is attached to the reinforcement frame and/or to at least one said module at least partially located in the through-hole, each said heat sink having a higher thermal conductivity than each said reinforcement frame.

16. The method of claim 15 wherein the one or more reinforcement frames are a plurality of reinforcement frames which are spaced from each other.

17. The method of claim 15 wherein the one or more reinforcement frames are a plurality of reinforcement frames, and the method further comprises dicing the first substrate between at least two said reinforcement frames to form a plurality of dies, each said reinforcement frame being in one of the dies.

18. The method of claim 15 wherein the first substrate comprises one or more test pads for testing the assembly which are located outside of the one or more reinforcement frames.

19. The method of claim 18 wherein at least one said test pad is located between at least two said reinforcement frames.

20. The method of claim 15 wherein attaching the one or more reinforcement frames to the first substrate comprises directly bonding the one or more reinforcement frames to the first substrate.

21. The method of claim 15 wherein at least one said heat sink overlying at least one said through-hole in at least one said reinforcement frame is attached to the reinforcement frame.

22. The method of claim 15 wherein at least one said heat sink overlying at least one said through-hole is attached to at least one said module at least partially located in the through-hole.

* * * * *